US008772084B2

(12) United States Patent
Lee et al.

(10) Patent No.: US 8,772,084 B2
(45) Date of Patent: Jul. 8, 2014

(54) MULTI-CHIP SEMICONDUCTOR PACKAGE AND METHOD OF FABRICATING THE SAME

(75) Inventors: Jong-Gi Lee, Yongin-si (KR); Kwang-Yong Lee, Anyang-si (KR); Min-Ho Lee, Asan-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 140 days.

(21) Appl. No.: 13/618,041

(22) Filed: Sep. 14, 2012

(65) Prior Publication Data

US 2013/0078763 A1    Mar. 28, 2013

(30) Foreign Application Priority Data

Sep. 22, 2011    (KR) .................... 10-2011-0095948

(51) Int. Cl.
   *H01L 21/44*    (2006.01)
   *H01L 23/02*    (2006.01)

(52) U.S. Cl.
   USPC ........... 438/106; 438/107; 438/127; 257/686; 257/700

(58) Field of Classification Search
   USPC .......... 438/106, 107, 127; 257/678, 686, 700, 257/734
   See application file for complete search history.

(56) References Cited

U.S. PATENT DOCUMENTS

| 6,080,596 | A | 6/2000 | Vindasius et al. |
| 6,225,726 | B1 | 5/2001 | Rowe et al. |
| 6,239,496 | B1 * | 5/2001 | Asada ........................ 257/777 |
| 6,486,528 | B1 | 11/2002 | Pedersen et al. |
| 7,215,018 | B2 | 5/2007 | Vindasius et al. |
| 2008/0303131 | A1 | 12/2008 | McElrea et al. |
| 2010/0244268 | A1 | 9/2010 | Tang et al. |

FOREIGN PATENT DOCUMENTS

| KR | 1020010022894 | 3/2001 |
| KR | 1020100050976 | 5/2010 |

* cited by examiner

*Primary Examiner* — Hsien Ming Lee
(74) *Attorney, Agent, or Firm* — Stanzione & Kim, LLP

(57) ABSTRACT

A first semiconductor chip having a first projection electrode formed on an upper surface thereof is prepared. A second semiconductor chip having a second projection electrode is mounted on the first semiconductor chip to expose the first projection electrode. An insulating film is formed between the first projection electrode and the second projection electrode. A groove is formed in the insulating film. An interconnection configured to fill an inside of the groove and connected to the first projection electrode and the second projection electrode is formed.

20 Claims, 26 Drawing Sheets

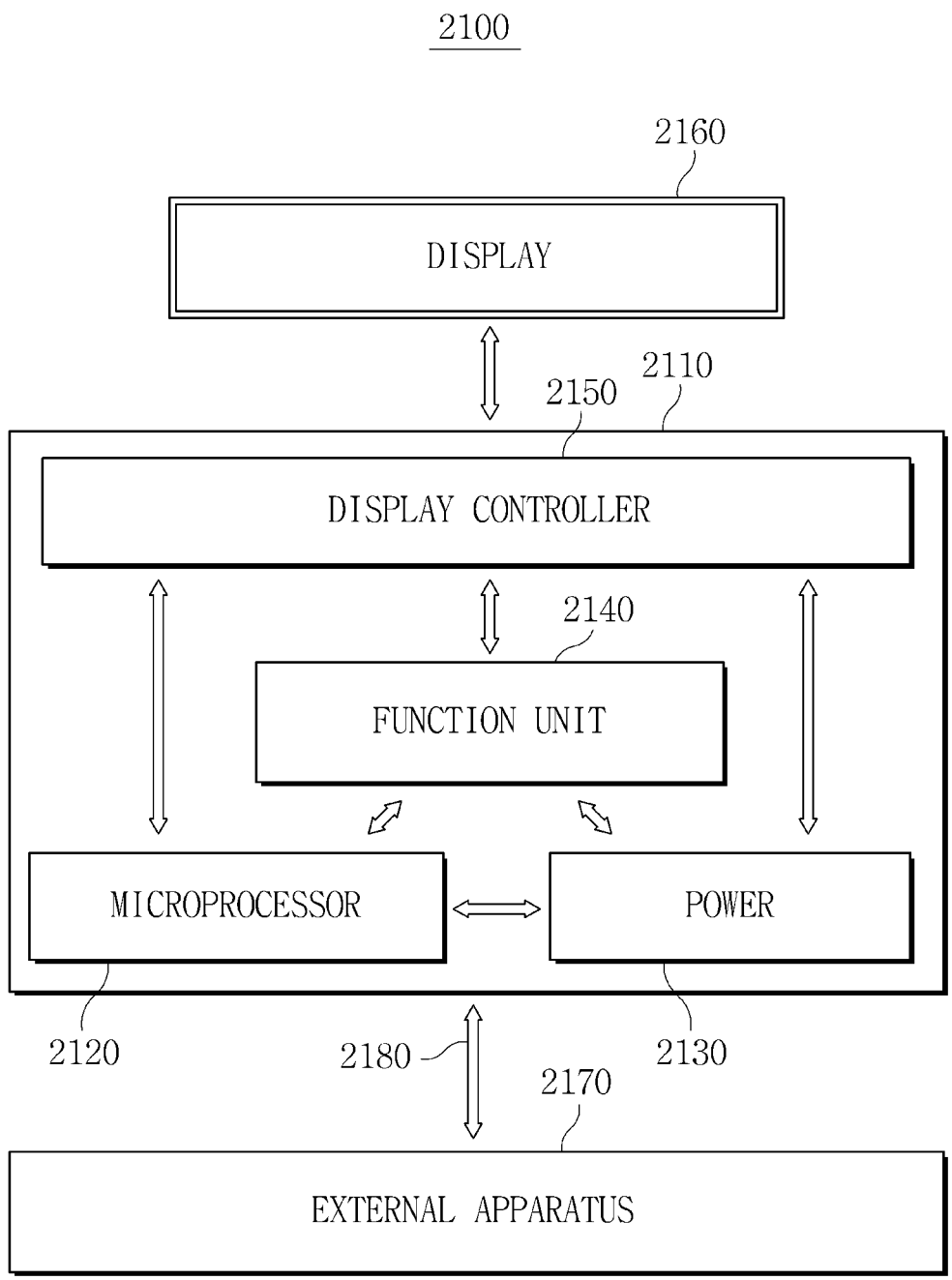

MULTI-CHIP SEMICONDUCTOR PACKAGE AND METHOD OF FABRICATING THE SAME

CROSS-REFERENCE TO RELATED APPLICATIONS

This application claims priority under 35 U.S.C. §119 to Korean Patent Application No. 10-2011-0095948 filed on Sep. 22, 2011, the disclosure of which is hereby incorporated by reference in its entirety.

BACKGROUND OF THE INVENTION

1. Field of the Invention

Embodiments of the inventive concept relate to a wireless multi-chip semiconductor package and a method of fabricating the same.

2. Description of the Related Art

As electronic instruments are miniaturized and slimmed, chip stack package techniques in which a plurality of memory chips are mounted in one package are being variously researched.

SUMMARY OF THE INVENTION

Embodiments of the inventive concept provide a method of fabricating a semiconductor package and a semiconductor package that are capable of mounting a plurality of semiconductor chips while decreasing a signal transmission path, reducing a cost and increasing productivity.

Additional features and utilities of the present general inventive concept will be set forth in part in the description which follows and, in part, will be obvious from the description, or may be learned by practice of the general inventive concept.

Embodiments of the inventive concept provide a method of fabricating a semiconductor package. The method includes preparing a first semiconductor chip having a first projection electrode formed on an upper surface thereof. A second semiconductor chip having a second projection electrode is mounted on the first semiconductor chip to expose the first projection electrode. An insulating film is formed between the first projection electrode and the second projection electrode. A groove is formed in the insulating film. An interconnection configured to fill an inside of the groove and connected to the first projection electrode and the second projection electrode is formed.

In an applied embodiment, forming the groove may include forming the groove such that a width of the groove is smaller than that of the first projection electrode.

In an embodiment, forming the groove may include removing a portion of the insulating film using a laser.

In an embodiment, forming the interconnection may include filling the groove by melting a portion of the second projection electrode.

In an embodiment, the interconnection may include the same material film as the second projection electrode. The interconnection may be in physical continuity with the second projection electrode.

In an embodiment, forming the interconnection may include providing a conductive paste, a conductive ball, or a combination thereof in the groove.

In an embodiment, the interconnection may include a material that melts at a temperature lower than those of the first projection electrode and the second projection electrode.

In an embodiment, the interconnection may have a vertical depth larger than a horizontal width thereof.

In an embodiment, the interconnection may cover a portion of an upper surface of the insulating film.

In an embodiment, the interconnection may have a width smaller than that of the first projection electrode.

In an embodiment, the interconnection may contact an upper surface of the first projection electrode and a side surface of the second projection electrode.

In an embodiment, a sidewall of the groove may be uneven.

In an embodiment, the insulating film may fill between the first semiconductor chip and the second semiconductor chip.

In an embodiment, a substrate may be attached to a bottom of the first semiconductor chip. A logic chip and a buffer chip may be mounted between the substrate and the first semiconductor chip. An encapsulation material configured to cover the logic chip, the buffer chip, the first semiconductor chip and the second chip may be formed on the substrate.

In addition, embodiments according to the inventive concept provide another method of fabricating a semiconductor package. The method includes preparing a first semiconductor chip and a second semiconductor chip. The first semiconductor chip has a first chip pad and a first laser blocking electrode formed on the first chip pad. The second semiconductor chip has a second chip pad and a second laser blocking electrode formed on the second chip pad. The second semiconductor chip is mounted on the first semiconductor chip to expose the first laser blocking electrode. An insulating film is formed between the first laser blocking electrode and the second laser blocking electrode. A groove is formed in the insulating film using a laser. An interconnection in contact with the first laser blocking electrode and the second laser blocking electrode is formed in the groove.

In addition, embodiments of the inventive concept provide a semiconductor package. The semiconductor package includes a first semiconductor chip having a first projection electrode formed on an upper surface thereof. A second semiconductor chip having a second projection electrode formed on an upper surface thereof is mounted on the first semiconductor chip. The first projection electrode is exposed. A first insulating film is formed between the first projection electrode and the second projection electrode. A first groove is formed in the first insulating film. A first interconnection in contact with the first projection electrode and the second projection electrode is formed in the first groove. The first groove has a width smaller than that of the first projection electrode.

In an embodiment, the first interconnection may have a vertical height larger than a horizontal width thereof.

In an embodiment, the first interconnection may cover a portion of an upper surface of the first insulating film.

In an embodiment, the first interconnection may have a horizontal width smaller than that of the first projection electrode.

In an embodiment, the first interconnection may include the same material as the second projection electrode. The first interconnection may be in physical continuity with the second projection electrode.

In an embodiment, the first interconnection may contact an upper surface of the first projection electrode and a side surface of the second projection electrode.

In an embodiment, the first interconnection may include a material that melts at a temperature lower than those of the first projection electrode and the second projection electrode.

In an embodiment, the first insulating film may be interposed between the first interconnection and the second semiconductor chip. The first interconnection may be isolated from the second semiconductor chip by the first insulating film.

In an embodiment, the first insulating film may fill between the first semiconductor chip and the second semiconductor chip.

In an embodiment, a substrate may be attached to a bottom of the first semiconductor chip. An encapsulation material configured to cover the first semiconductor chip and the second semiconductor chip may be provided.

In an embodiment, a logic chip may be attached between the substrate and the first semiconductor chip. A buffer chip adjacent to the logic chip may be provided.

In an embodiment, a third semiconductor chip having a third projection electrode formed on an upper surface thereof may be mounted on the second semiconductor chip. A fourth semiconductor chip mounted to expose the third projection electrode and having a fourth projection electrode may be provided. A second insulating film may be formed between the third projection electrode and the fourth projection electrode. A second groove may be formed in the second insulating film between the third projection electrode and the fourth projection electrode. A second interconnection in contact with the third projection electrode and the fourth projection electrode may be formed on the second groove. The second semiconductor chip may be offset-aligned on the first semiconductor chip in a first direction, and the fourth semiconductor chip may be offset-aligned on the third semiconductor chip in a second direction different from the first direction.

In an embodiment, an interposer may be provided between the second semiconductor chip and the third semiconductor chip. The third projection electrode may be electrically connected to the second projection electrode via the interposer.

Further, embodiments of the inventive concept provide another semiconductor package. The semiconductor package includes a first semiconductor chip having a first projection electrode formed on an upper surface thereof. A second semiconductor chip mounted on the first semiconductor chip to expose the first projection electrode and having a second projection electrode formed on an upper surface thereof is provided. An insulating film is formed between the first projection electrode and the second projection electrode. A groove configured to expose portions of side surfaces of the first projection electrode and the second projection electrode is formed in the insulating film. An interconnection in contact with exposed surfaces of the first projection electrode and the second projection electrode is formed in the groove.

In an embodiment, the insulating film may extend between the first semiconductor chip and the second semiconductor chip.

The foregoing and/or other aspects and utilities of the present general inventive concept may also be achieved by providing a method of fabricating a semiconductor package comprising preparing a substrate including a finger electrode and a substrate projection electrode, the substrate projection electrode being formed on the finger electrode, mounting a first semiconductor chip on the substrate, the first semiconductor chip including a first chip pad and a first projection electrode formed on the first chip pad, the first semiconductor chip being arranged to not overlap the finger electrode or the substrate projection electrode, mounting a second semiconductor chip on the first semiconductor chip to expose the first projection electrode, the second semiconductor chip including a second chip pad and a second projection electrode formed on the second chip pad, the first and second semiconductor chips being mounted using an insulating film, the insulating film being formed between the first projection electrode and the second projection electrode, forming a first groove in the insulating film between the substrate projection electrode and the first projection electrode, a second groove being formed between the first projection electrode and the second projection electrode, forming a first interconnection along the first groove and a second interconnection along the second groove, the first and second interconnections being physically and/or electrically connected to the substrate projection electrode, the first projection electrode, and the second projection electrode, and forming first and second external terminals at a rear surface of the substrate.

The method may further comprise mounting a logic chip and a buffer chip between the substrate and the first semiconductor chip, and forming on the substrate an encapsulation material configured to cover the logic chip, the buffer chip, the first semiconductor chip, and the second semiconductor chip.

The method may further comprise offset-mounting the first and second semiconductor chips in a first direction such that the first and second semiconductor chip constitute a cascade structure.

The method may further comprise forming the first and second grooves such that the first and second grooves have uneven sidewalls and bottoms.

The method may further comprise interposing a first under bump metal between the first chip pad and the first projection electrode, and interposing a second under bump metal between the second chip pad and the second projection electrode.

BRIEF DESCRIPTION OF THE DRAWINGS

The foregoing and other features and utilities of the present general inventive concepts will be apparent from the more particular description of preferred embodiments of the inventive concepts, as illustrated in the accompanying drawings in which like reference characters refer to the same parts throughout the different views. The drawings are not necessarily to scale, emphasis instead being placed upon illustrating the principles of the inventive concepts. In the drawings:

FIGS. 31 and 32 are a perspective view and a system block diagram of an electronic device in accordance with an embodiment of the inventive concept.

DETAILED DESCRIPTION OF THE PREFERRED EMBODIMENTS

Figure 1:
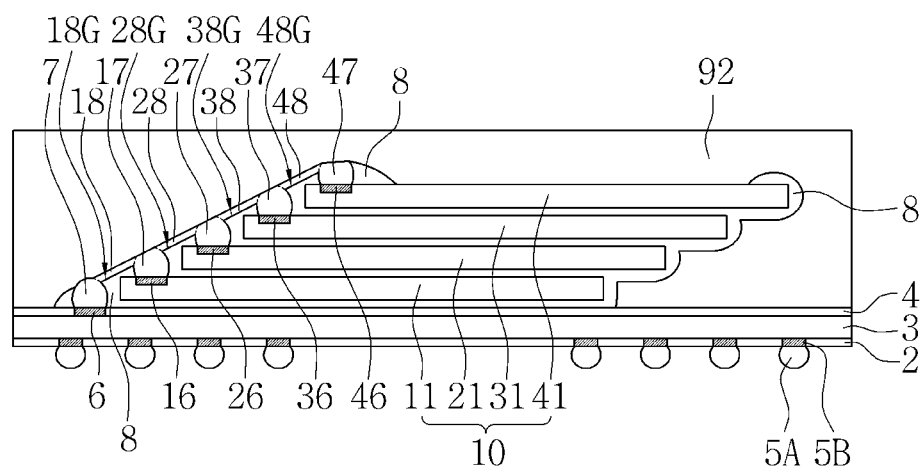
FIG. 1 is a cross-sectional view for explaining a semiconductor package in accordance with an embodiment of the inventive concept.

Various embodiments will now be described more fully with reference to the accompanying drawings in which some embodiments are shown. These inventive concepts may, however, be embodied in different forms and should not be construed as limited to the embodiments set forth herein. Rather, these embodiments are provided so that this disclosure is thorough and complete and fully conveys the inventive concept to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments are described herein with reference to cross-sectional illustrations that are schematic illustrations of idealized embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2A:
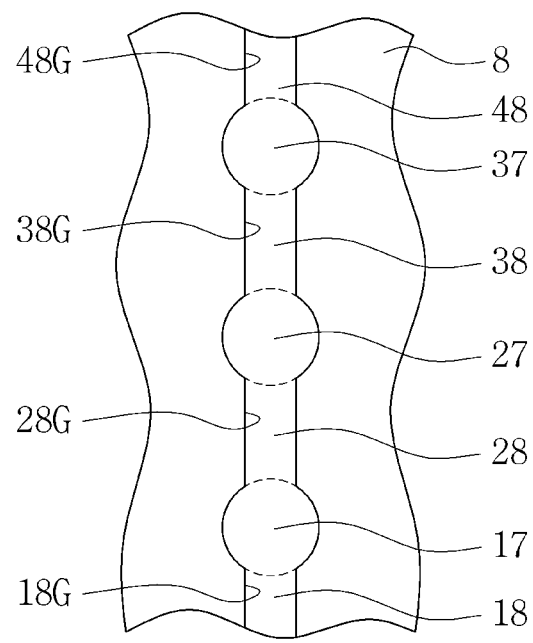
FIGS. 2A to 2C are layouts showing a portion of FIG. 1 from another angle.
Figure 2B:
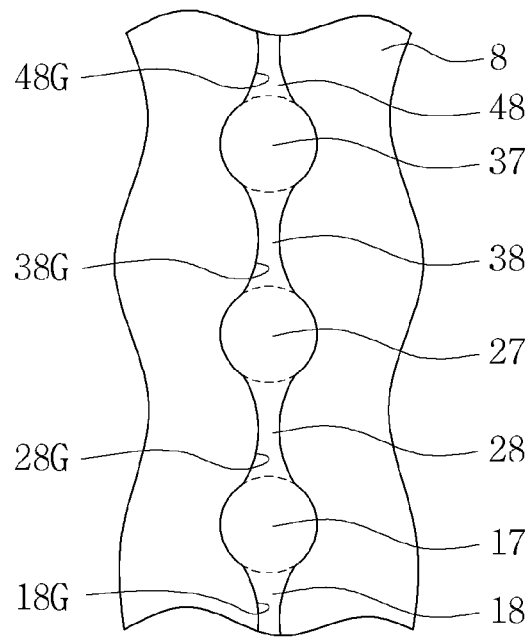
Figure 2C:
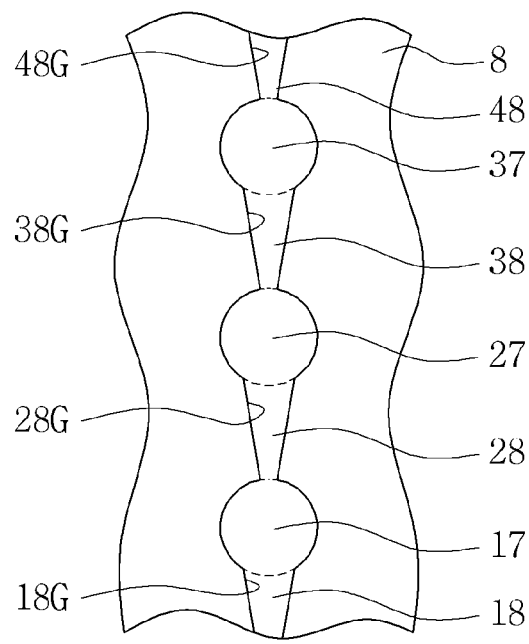
Figure 3A:
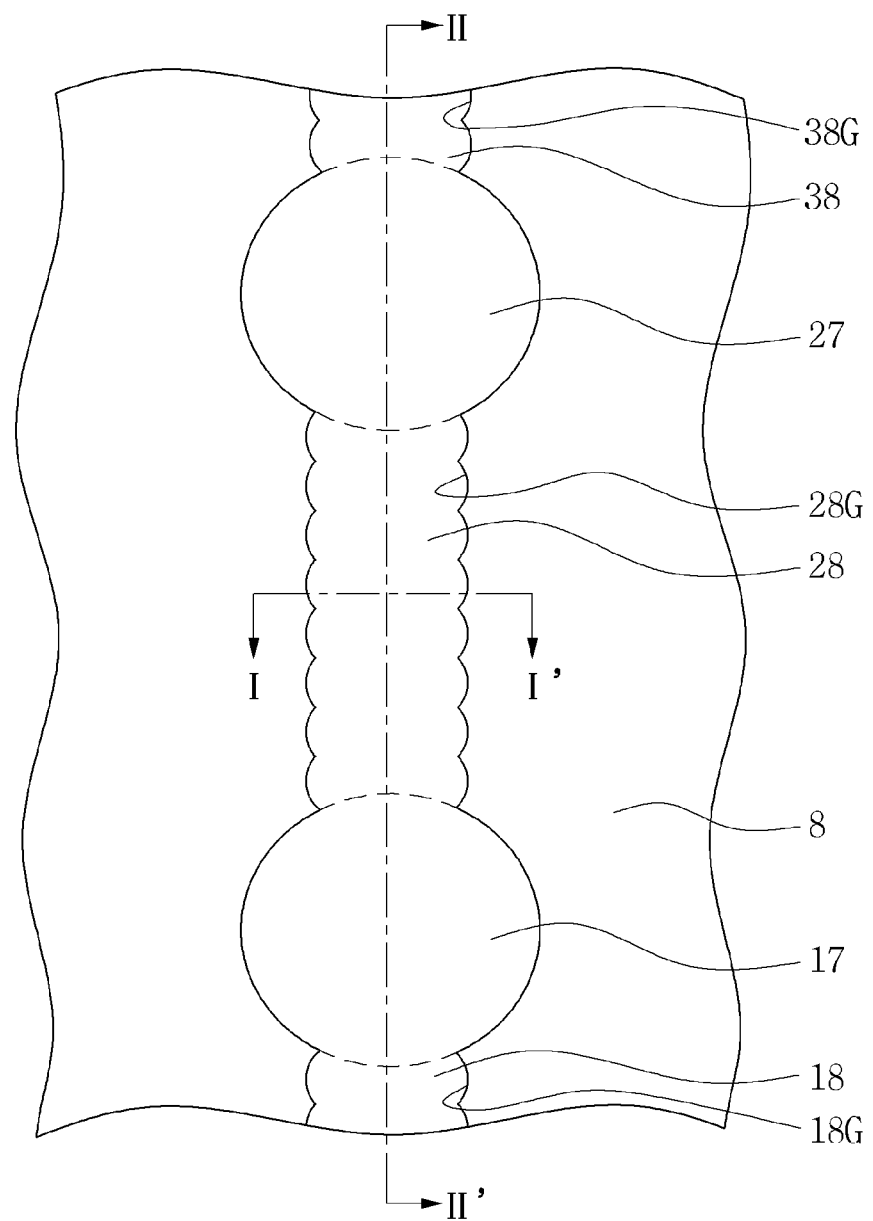
FIG. 3A is an enlarged view of a portion of FIG. 2A.
Figure 3B:
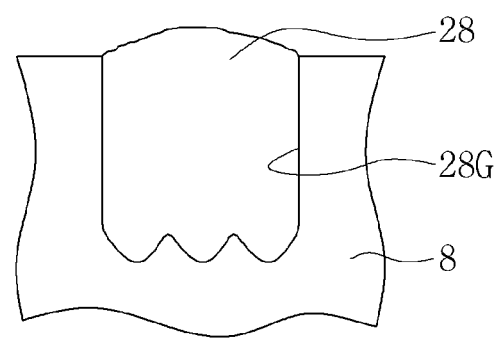
FIG. 3B is a partial cross-sectional view taken along line I-I' of FIG. 3A.
Figure 3C:
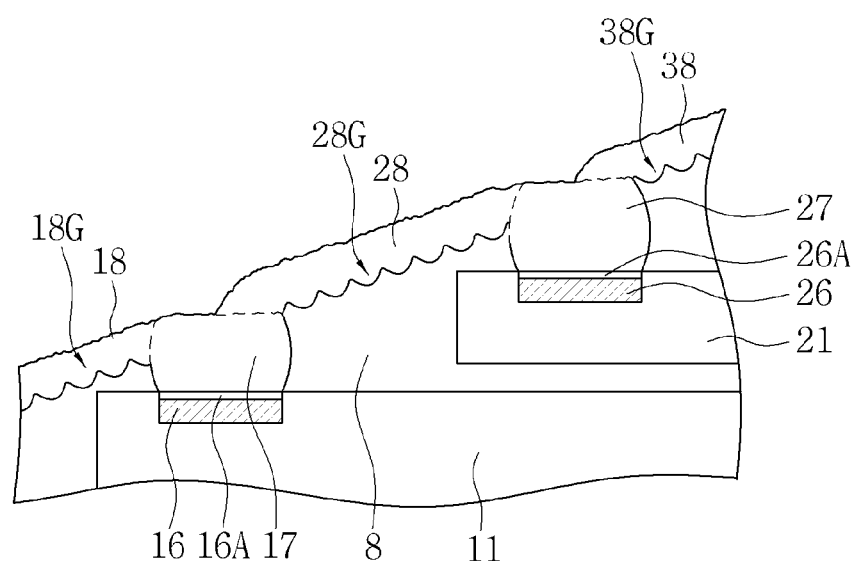
FIG. 3C is a partial cross-sectional view taken along line II-II' of FIG. 3A.
Figure 4A:
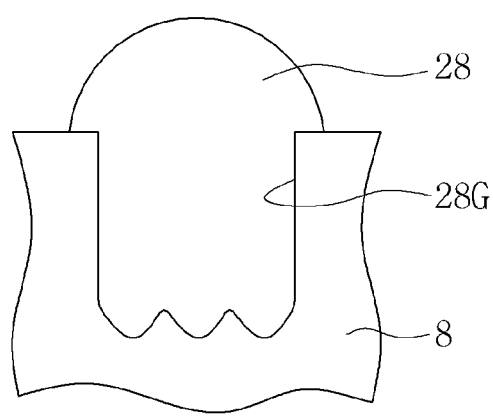
FIGS. 4A and 4B are partial cross-sectional views for explaining applied embodiments of FIG. 3B.
Figure 4B:
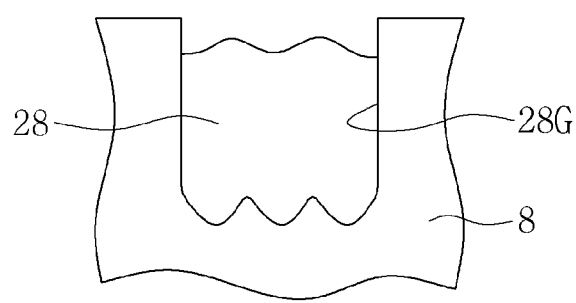

FIG. 1 is a cross-sectional view for explaining a semiconductor package in accordance with an embodiment of the inventive concept, FIGS. 2A to 2C are layouts showing a portion of FIG. 1 from another angle, FIG. 3A is an enlarged view of a portion of FIG. 2A, FIG. 3B is a partial cross-sectional view taken along line I-I' of FIG. 3A, FIG. 3C is a partial cross-sectional view taken along line II-II' of FIG. 3A, and FIGS. 4A and 4B are partial cross-sectional views for explaining applied embodiments of FIG. 3B.

Referring to FIG. 1, first to fourth semiconductor chips 11, 21, 31 and 41 may be mounted on a substrate 3 using an insulating film 8. The first to fourth semiconductor chips 11, 21, 31 and 41 may constitute a first chip stack 10.

The substrate 3 may include a finger electrode 6, and a substrate projection electrode 7 may be formed on the finger electrode 6. The first semiconductor chip 11 may include a first chip pad 16, and a first projection electrode 17 may be formed on the first chip pad 16. The second semiconductor chip 21 may include a second chip pad 26, and a second projection electrode 27 may be formed on the second chip pad 26. The third semiconductor chip 31 may include a third chip pad 36, and a third projection electrode 37 may be formed on the third chip pad 36. The fourth semiconductor chip 41 may include a fourth chip pad 46, and a fourth projection electrode 47 may be formed on the fourth chip pad 46.

The substrate projection electrode 7, the first projection electrode 17, the second projection electrode 27, the third projection electrode 37, and the fourth projection electrode 47 may include a solder ball, a conductive bump, a conductive pin, a conductive spacer, or a combination thereof. In addition, in this embodiment, the substrate projection electrode 7, the first projection electrode 17, the second projection electrode 27, the third projection electrode 37, and the fourth projection electrode 47 will be described under the assumption that they are solder balls or solder bumps. Accordingly, the substrate projection electrode 7, the first projection electrode 17, the second projection electrode 27, the third projection electrode 37, and the fourth projection electrode 47 may have spherical or rounded surfaces.

The first to fourth semiconductor chips 11, 21, 31 and 41 may be sequentially offset-mounted in a first direction. The first to fourth semiconductor chips 11, 21, 31 and 41 may constitute a cascade structure. Specifically, the first semiconductor chip may be aligned to be exposed while not overlapping the finger electrode 6 or the substrate projection electrode 7. The second semiconductor chip 21 may be offset-aligned on the first semiconductor chip 11 to be exposed while not overlapping the first chip pad 16 or the first projection electrode 17. The third semiconductor chip 31 may be offset-aligned on the second semiconductor chip 21 to be exposed while not overlapping the second chip pad 26 or the second projection electrode 27. The fourth semiconductor chip 41 may be offset-aligned on the third semiconductor chip 31 to be exposed while not overlapping the third chip pad 36 or the third projection electrode 37.

The insulating film 8 may completely fill between the first to fourth semiconductor chips 11, 21, 31 and 41 and completely fill between the first chip stack 10 and the substrate 3. In addition, the insulating film 8 may cover side surfaces of the first to fourth semiconductor chips 11, 21, 31 and 41. Further, the insulating film 8 may cover between the substrate projection electrode 7, the first projection electrode 17, the second projection electrode 27, the third projection electrode 37 and the fourth projection electrode 47. The insulating film 8 may have adhesion. For example, the insulating film 8 may include a polymer resin or a molding compound.

First to fourth grooves 18G, 28G, 38G and 48G may be formed in the insulating film 8. The first to fourth grooves 18G, 28G, 38G and 48G may be formed between the substrate projection electrode 7, the first projection electrode 17, the second projection electrode 27, the third projection electrode 37 and the fourth projection electrode 47.

First to fourth interconnections 18, 28, 38, 48 may be formed along the first to fourth grooves 18G, 28G, 38G and 48G. The first to fourth interconnections 18, 28, 38 and 48 may be physically and/or electrically connected to the substrate projection electrode 7, the first projection electrode 17, the second projection electrode 27, the third projection electrode 37 and the fourth projection electrode 47. Each of the first to fourth interconnections 18, 28, 38 and 48 may be materially in continuity with a corresponding one of the first projection electrode 17, the second projection electrode 27, the third projection electrode 37 and the fourth projection electrode 47. The first to fourth interconnections 18, 28, 38 and 48 may include the same material as the first projection electrode 17, the second projection electrode 27, the third projection electrode 37 and the fourth projection electrode 47. The insulating film 8 may be preserved between the first to fourth interconnections 18, 28, 38 and 48 and the first to fourth semiconductor chips 11, 21, 31 and 41. The first to fourth interconnections 18, 28, 38 and 48 may be isolated from the first to fourth semiconductor chips 11, 21, 31 and 41 by the insulating film 8.

An encapsulation material 92 configured to cover the first chip stack 10 may be formed on the substrate 3. First and second external terminals 5A and 5B may be formed at a rear surface of the substrate 3. The finger electrode 6 may be electrically connected to a corresponding one of the first and second external terminals 5A and 5B through the substrate 3. The first external terminal 5A may include a solder ball, a solder bump, a pin grid array, a lead grid array, a conductive tab, or a combination thereof. The second external terminal 5B may include a metal bump or a solder land.

In another embodiment, the substrate projection electrode 7, the first projection electrode 17, the second projection electrode 27, the third projection electrode 37 and the fourth projection electrode 47 may be referred to as laser blocking electrodes.

Referring to FIGS. 2A to 2C, the first to fourth grooves 18G, 28G, 38G and 48G and the first to fourth interconnections 18, 28, 38 and 48 may have various shapes. The first to fourth grooves 18G, 28G, 38G and 48G and the first to fourth interconnections 18, 28, 38 and 48 may have a smaller width than that of the first projection electrode 17, the second projection electrode 27 and the third projection electrode 37.

Referring to FIG. 2A, the first to fourth grooves 18G, 28G, 38G and 48G and the first to fourth interconnections 18, 28, 38 and 48 may maintain the same width. Referring to FIG. 2B, the first to fourth grooves 18G, 28G, 38G and 48G and the first to fourth interconnections 18, 28, 38 and 48 may have a center-concave shape. On the other hand, the first to fourth grooves 18G, 28G, 38G and 48G and the first to fourth interconnections 18, 28, 38 and 48 may have a center-convex shape. Referring to FIG. 2C, the first to fourth grooves 18G, 28G, 38G and 48G and the first to fourth interconnections 18, 28, 38 and 48 may have a relatively large upper width and a relatively small lower width. On the other hand, the first to fourth grooves 18G, 28G, 38G and 48G and the first to fourth interconnections 18, 28, 38 and 48 may have a relatively small upper width and a relatively small lower width.

Referring to FIGS. 3A to 3C, inner walls of the first to third grooves 18G, 28G and 38G may include rough surfaces corresponding to a size of a laser spot. That is, sidewalls and bottoms of the first to third grooves 18G, 28G and 38G may have a plurality of uneven semi-circular bottom surfaces or sidewalls. The first to third interconnections 18, 28 and 38 may be formed in the first to third grooves 18G, 28G and 38G. The uneven sidewalls and bottoms of the first to third grooves 18G, 28G and 38G may function to increase adhesion of the first to third interconnections 18, 28 and 38.

Referring to FIG. 3B, the first to third interconnections 18, 28 and 38 may fill the first to third grooves 18G, 28G and 38G, and may have uneven upper surfaces higher than an upper surface of the insulating film 8. The first to third interconnections 18, 28 and 38 may have a vertical height larger than a horizontal width thereof.

Referring to FIG. 3C, the first interconnection 18 may contact a side surface of the first projection electrode 17. The second interconnection 28 may contact an upper surface of the first projection electrode 17 and a side surface of the second projection electrode 27. The third interconnection 38 may contact the side surface of the projection electrode 27.

A first under bump metal (UBM) 16A may be formed on the first chip pad 16, and a second UBM 26A may be formed on the second chip pad 26. The first UBM 16A may be interposed between the first chip pad 16 and the first projection electrode 17, and the second UBM 26A may be interposed between the second chip pad 26 and the second projection electrode 27.

Referring to FIG. 4A, the first to third interconnections 18, 28 and 38 may completely fill the second groove 28G and partially cover the surface of the insulating film 8 adjacent thereto. The first to third interconnections 18, 28 and 38 may have concavely rounded upper surfaces at end surfaces thereof. For example, the second interconnection 28 may have a vertical depth larger than a horizontal width thereof.

Referring to FIG. 4B, the first to third interconnections 18, 28 and 38 may have recessed upper surfaces lower than the upper surface of the insulating film 8 adjacent thereto.

FIGS. 5 to 13B are cross-sectional views for explaining semiconductor packages in accordance with an embodiment of the inventive concept.

Figure 5:
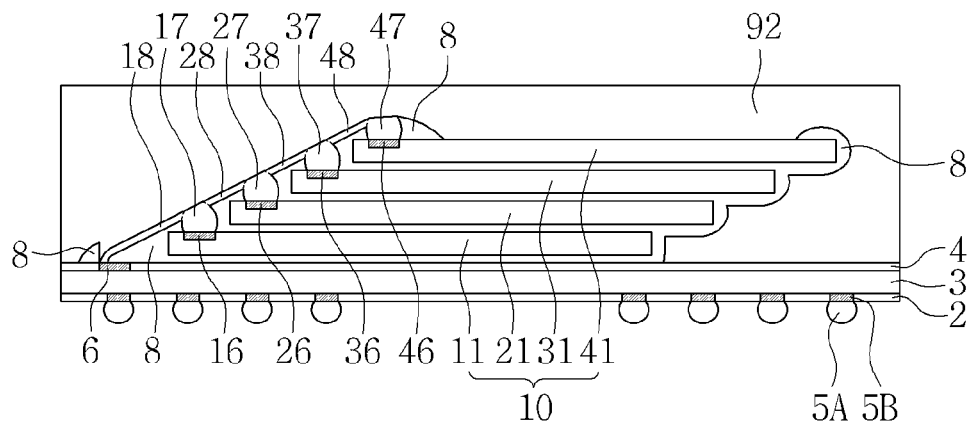
FIGS. 5 to 13B are cross-sectional views for explaining semiconductor packages in accordance with an embodiment of the inventive concept.

Referring to FIG. 5, a first interconnection 18 may be formed between a finger electrode 6 and a first projection electrode 17. One end of the first interconnection 18 may directly contact the finger electrode 6.

Figure 6A:
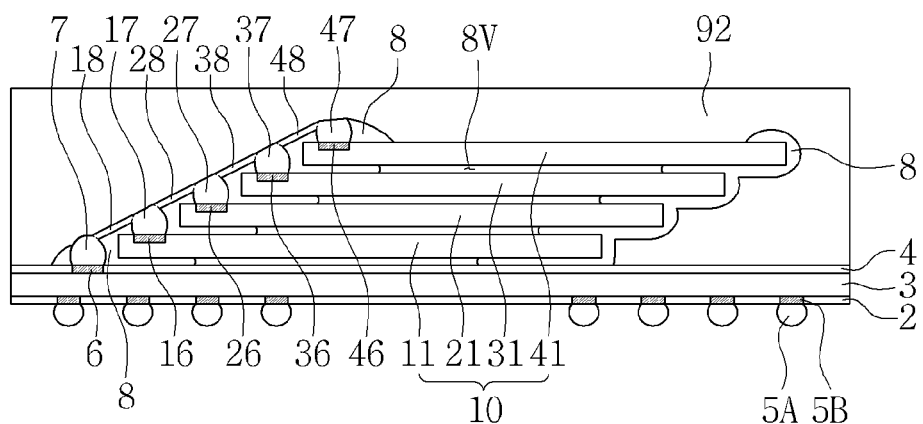

Referring to FIG. 6A, an insulating film 8 may be partially interposed between the first to fourth semiconductor chips 11, 21, 31 and 41 and may be partially interposed between the first semiconductor chip 11 and the substrate 3. In this case, empty spaces 8V may be provided between the first to fourth semiconductor chips 11, 21, 31 and 41 and between the first semiconductor chip 11 and the substrate 3.

Figure 6B:
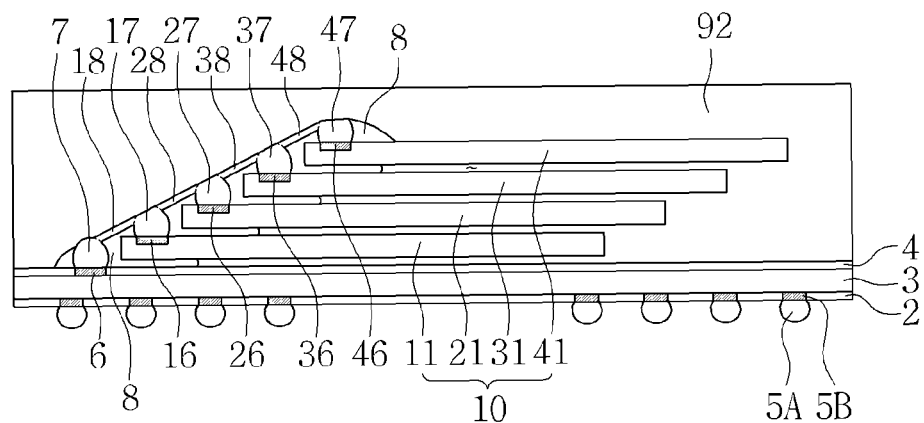

Referring to FIG. 6B, an insulating film 8 may be partially interposed between the first to fourth semiconductor chips 11, 21, 31 and 41 and may be partially interposed between the first semiconductor chip 11 and the substrate 3. The insulating film 8 may cover one side surfaces of the first to fourth semiconductor chips 11, 21, 31 and 41, and the other surfaces of the first to fourth semiconductor chips 11, 21, 31 and 41 may be exposed.

Figure 7A:
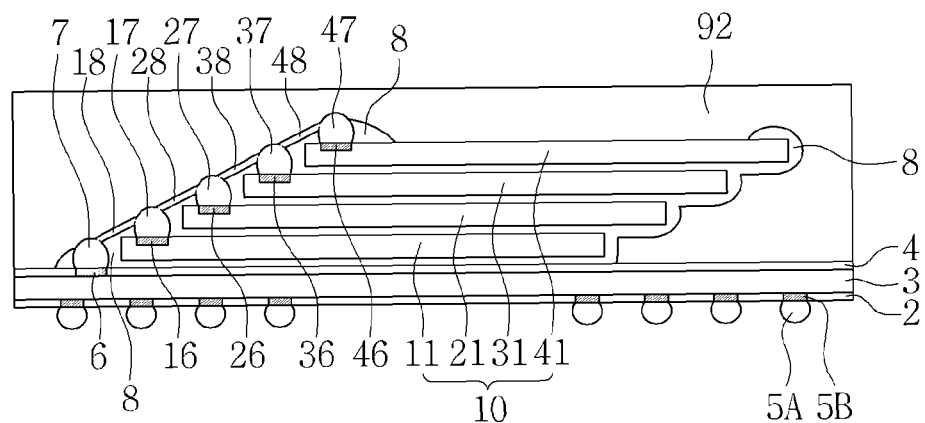
Figure 7B:
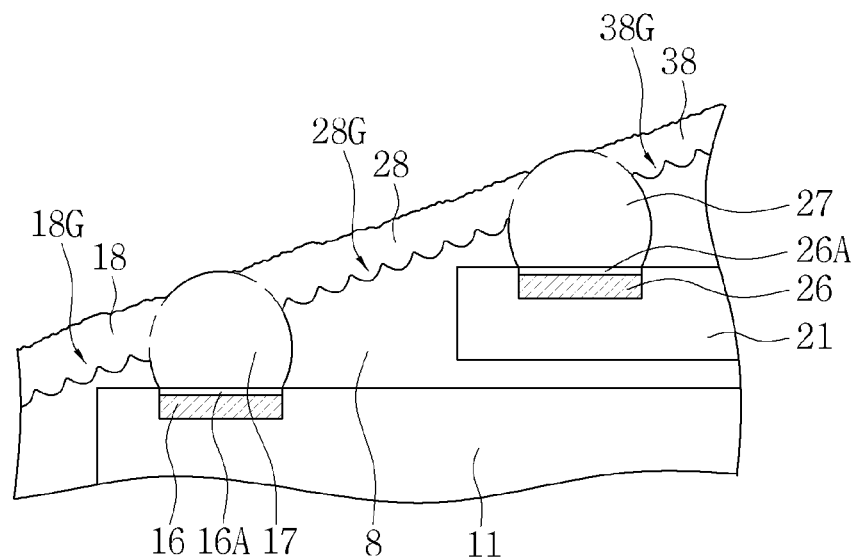

Referring to FIGS. 7A and 7B, first to fourth interconnections 18, 28, 38 and 48 may include a different material from a first projection electrode 17, a second projection electrode 27, a third projection electrode 37 and a fourth projection electrode 47. The first to fourth interconnections 18, 28, 38 and 48 may include a material that melts at a temperature lower than those of the first projection electrode 17, the second projection electrode 27, the third projection electrode 37 and the fourth projection electrode 47. The first to fourth interconnections 18, 28, 38 and 48 may contact side surfaces of the first projection electrode 17, the second projection electrode 27, the third projection electrode 37 and the fourth projection electrode 47.

Figure 8A:
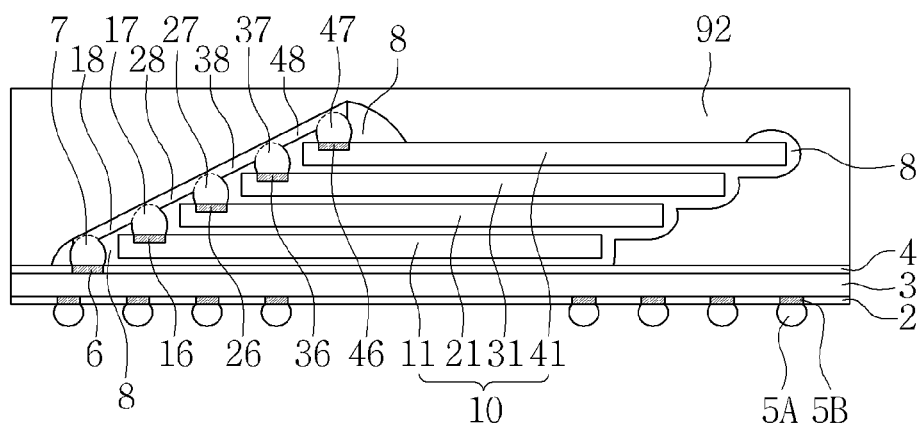
Figure 8B:
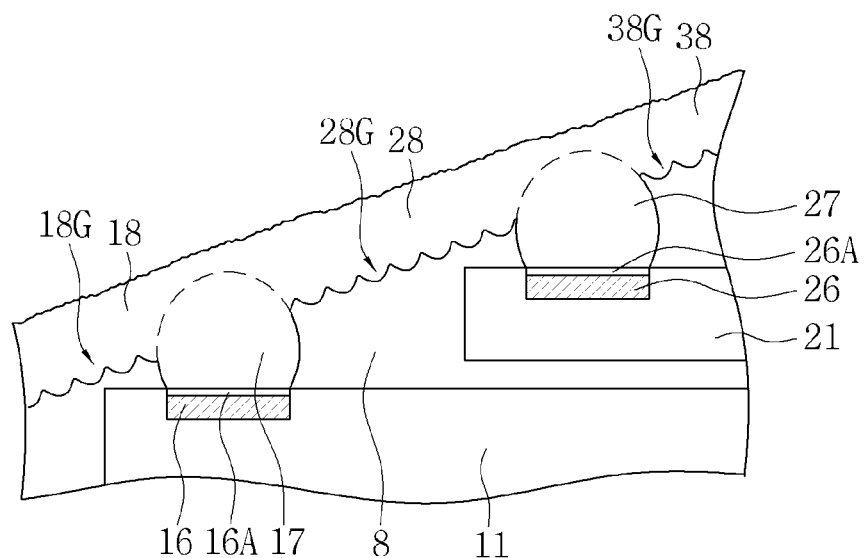

Referring to FIGS. 8A and 8B, first to fourth interconnections 18, 28, 38 and 48 may include a different material from a first projection electrode 17, a second projection electrode 27, a third projection electrode 37 and a fourth projection electrode 47. The first to fourth interconnections 18, 28, 38 and 48 may include a material that melts at a temperature lower than those of the first projection electrode 17, the second projection electrode 27, the third projection electrode 37 and the fourth projection electrode 47. The first to fourth interconnections 18, 28, 38 and 48 may cover side surfaces and upper surfaces of the substrate projection electrode 7, the first projection electrode 17, the second projection electrode 27, the third projection electrode 37 and the fourth projection electrode 47.

Figure 9A:
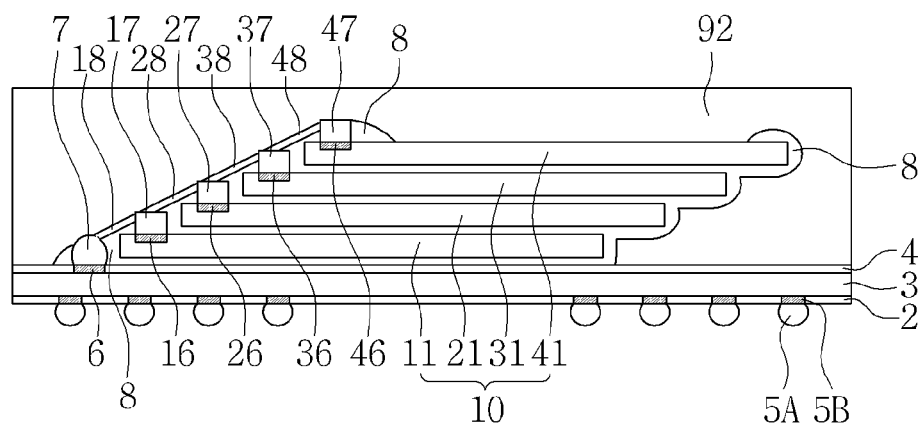
Figure 9B:
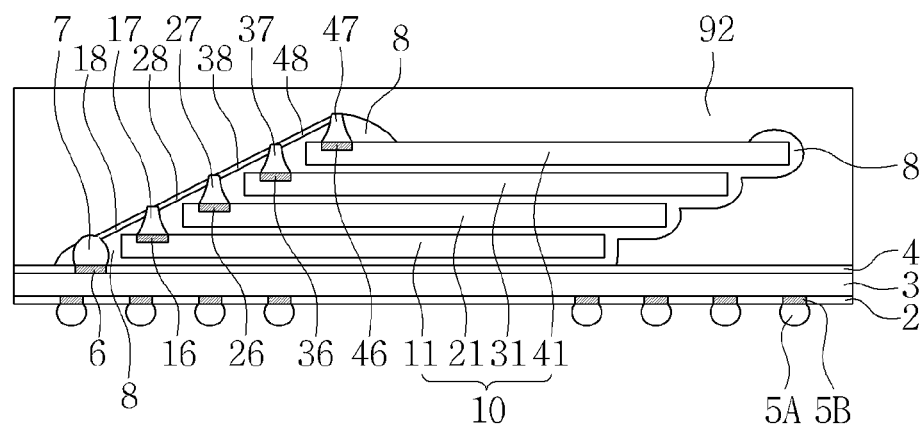

Referring to FIGS. 9A and 9B, a first projection electrode 17, a second projection electrode 27, a third projection electrode 37 and a fourth projection electrode 47 may be a conductive bump, a conductive pin, or a conductive spacer. Referring to FIG. 9A, a first projection electrode 17, a second projection electrode 27, a third projection electrode 37 and a fourth projection electrode 47 may have a pillar or mesa shape. That is, a first projection electrode 17, a second projection electrode 27, a third projection electrode 37 and a fourth projection electrode 47 may have flat upper surfaces and/or sidewalls. In another embodiment, first to fourth projection electrodes 17, 27, 37 and 47 may have a cylindrical or polygonal column shape. Referring to FIG. 9B, a first projection electrode 17, a second projection electrode 27, a third projection electrode 37 and a fourth projection electrode 47 may have a conical or trapezoidal shape. That is, a first projection electrode 17, a second projection electrode 27, a third projection electrode 37 and a fourth projection electrode 47 may have flat upper surfaces and/or sidewalls.

First to fourth interconnections 18, 28, 38 and 48 may include a different material from the first projection electrode 17, the second projection electrode 27, the third projection electrode 37 and the fourth projection electrode 47. The first to fourth interconnections 18, 28, 38 and 48 may include a material that melts at a temperature lower than those of the first projection electrode 17, the second projection electrode 27, the third projection electrode 37 and the fourth projection electrode 47. For example, the first projection electrode 17, the second projection electrode 27, the third projection electrode 37 and the fourth projection electrode 47 may include a metal, and the first to fourth interconnections 18, 28, 38 and 48 may include a solder.

Figure 10A:
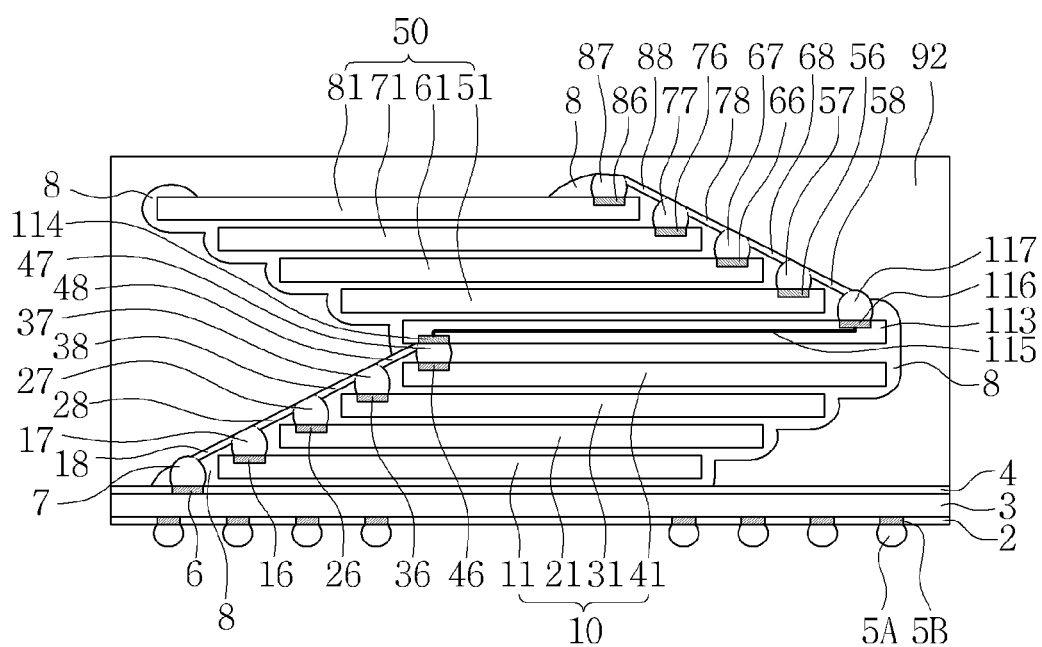

Referring to FIG. 10A, an interposer 113 may be mounted on a first chip stack 10. An insulating film 8 may be interposed between the first chip stack 10 and the interposer 113. The interposer 113 may include a lower pad 114, an inner interconnection 115 and an upper pad 116. The lower pad 114 may contact a fourth projection electrode 47. The upper pad 116 may be electrically connected to the lower pad 114 via the inner interconnection 115. An interposer projection electrode 117 may be formed on the upper pad 116.

Fifth to eighth semiconductor chips 51, 61, 71 and 81 may be mounted on the interposer 113 using the insulating film 8. The fifth to eighth semiconductor chips 51, 61, 71 and 81 may constitute a second chip stack 50. The insulating film 8 may completely fill between the fifth to eighth semiconductor chips 51, 61, 71 and 81, and may completely fill between the second chip stack 50 and the interposer 113.

The fifth semiconductor chip 51 may include a fifth chip pad 56, and a fifth projection electrode 57 may be formed on the fifth chip pad 56. The sixth semiconductor chip 61 may include a sixth chip pad 66, and a sixth projection electrode 67 may be formed on the sixth chip pad 66. The seventh semiconductor chip 71 may include a seventh chip pad 76, and a seventh projection electrode 77 may be formed on the seventh chip pad 76. The eighth semiconductor chip 81 may include an eighth chip pad 86, and an eighth projection electrode 87 may be formed on the eighth chip pad 86.

The fifth to eighth semiconductor chips 51, 61, 71 and 81 may be sequentially offset-mounted in a second direction different from the first direction. The fifth to eighth semiconductor chips 51, 61, 71 and 81 may constitute a cascade structure. The first direction may be opposite to the second direction. For example, the first to fourth semiconductor chips 11, 21, 31 and 41 may be sequentially offset-stacked in a rightward direction, and the fifth to eighth semiconductor chips 51, 61, 71 and 81 may be sequentially offset-stacked in a leftward direction.

Fifth to eighth interconnections 58, 68, 78 and 88, similar to the first to fourth interconnections 18, 28, 38 and 48, may be formed between the interposer projection electrode 117, the fifth projection electrode 57, the sixth projection electrode 67, the seventh projection electrode 77 and the eighth projection electrode 87. An encapsulation material 92 configured to cover the first chip stack 10 and the second chip stack 50 may be formed on the substrate 3.

Figure 10B:
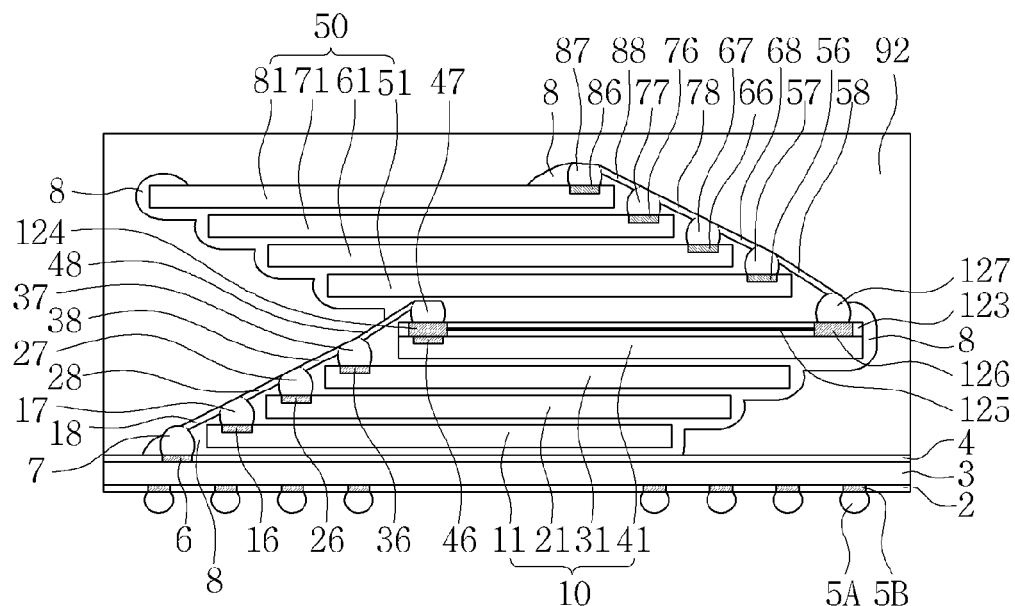

Referring to FIG. 10B, a redistribution layer 123 may be formed on a fourth semiconductor chip 41. The redistribution layer 123 may include a first redistribution pad 124, an inner interconnection 125 and a second redistribution pad 126. The first redistribution pad 124 may be connected to a fourth chip pad 46. A fourth projection electrode 47 may be formed on the first redistribution pad 124. The second redistribution pad 126 may be electrically connected to the first redistribution pad 124 via the inner interconnection 125. A redistribution projection electrode 127 may be formed on the second redistribution pad 126.

Fifth to eighth semiconductor chips 51, 61, 71 and 81 may be mounted on the redistribution layer 123 using an insulating film 8. The fifth to eighth semiconductor chips 51, 61, 71 and 81 may constitute a second chip stack 50. Fifth to eighth interconnections 58, 68, 78 and 88 may be formed between the redistribution projection electrode 127, the fifth projection electrode 57, the sixth projection electrode 67, the seventh projection electrode 77 and the eighth projection electrode 87.

Figure 11A:
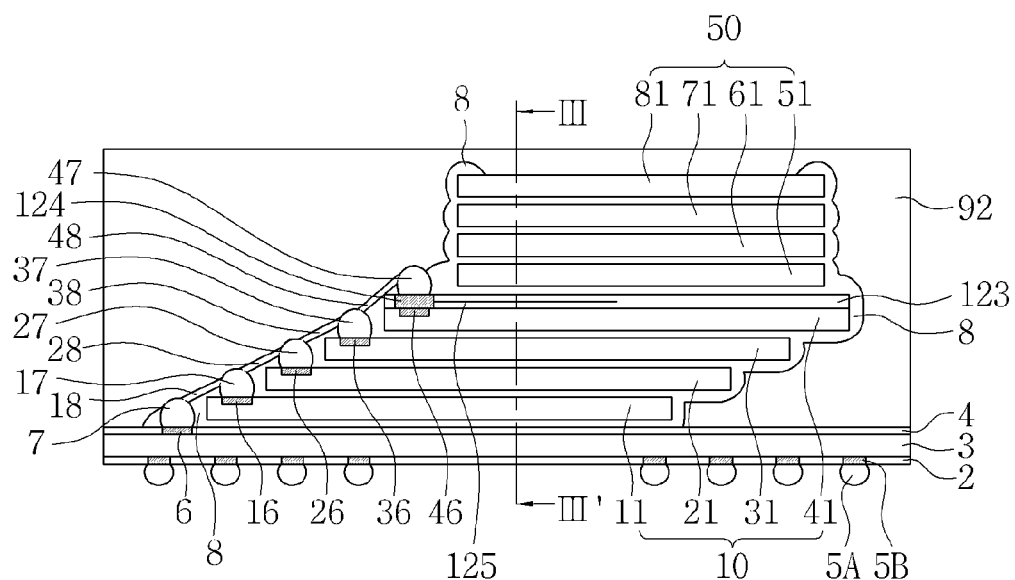
Figure 11B:
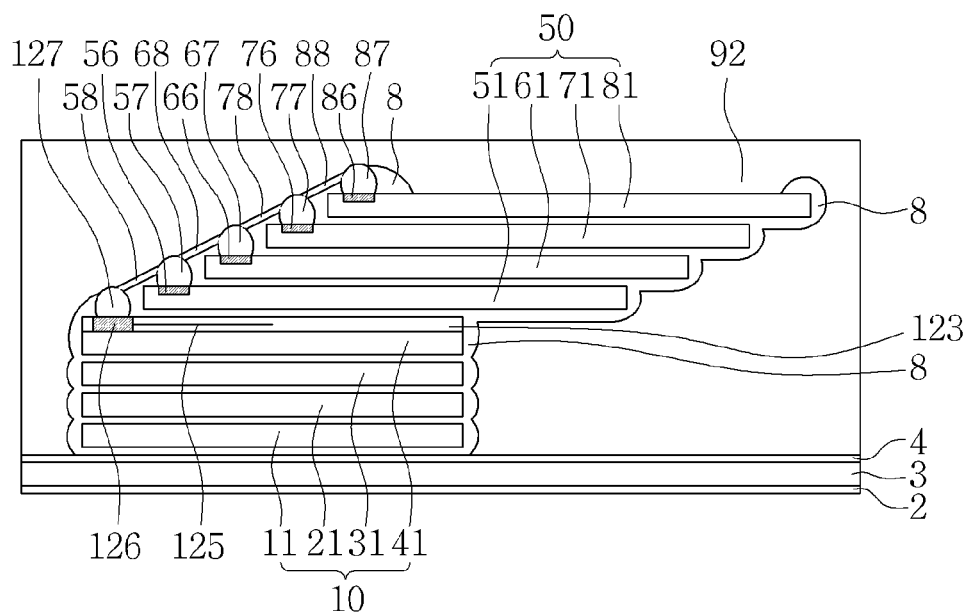

FIG. 11B is a cross-sectional view taken along line III-III' of FIG. 11A.

Referring to FIGS. 11A and 11B, the redistribution layer 123 may be formed on the fourth semiconductor chip 41. The redistribution layer 123 may include the first redistribution pad 124, the inner interconnection 125 and the second redistribution pad 126. The first redistribution pad 124 may be connected to the fourth chip pad 46. The fourth projection electrode 47 may be formed on the first redistribution pad 124. The second redistribution pad 126 may be electrically connected to the first redistribution pad 124 via the inner interconnection 125. A redistribution projection electrode 127 may be formed on the second redistribution pad 126.

The first to fourth semiconductor chips 11, 21, 31 and 41 may be sequentially offset-mounted in the first direction. The fifth to eighth semiconductor chips 51, 61, 71 and 81 may be sequentially offset-mounted on the redistribution layer 123 in the second direction different from the first direction. The second direction may intersect the first direction at a 90° angle.

Figure 12:
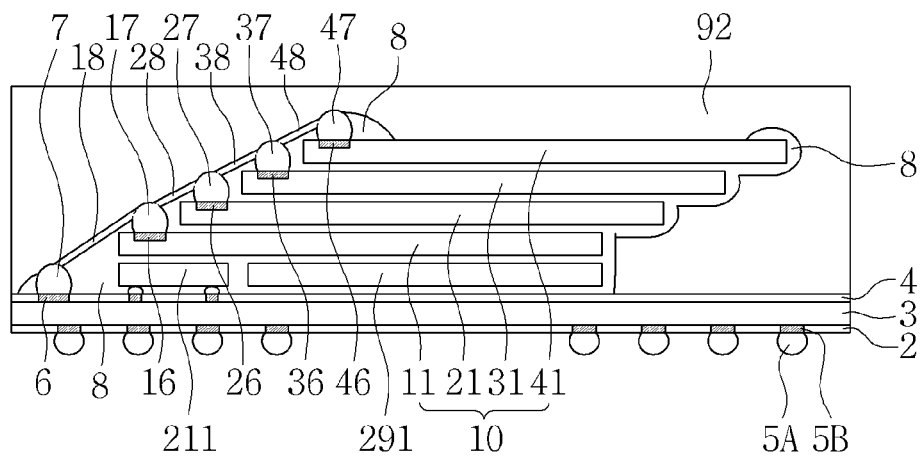

Referring to FIG. 12, a logic chip 211 and a support frame 291 may be attached on a substrate 3. The logic chip 211 may be mounted using a flip-chip technique. The support frame 291 may be mounted on the same level as the logic chip 211. First to fourth semiconductor chips 11, 21, 31 and 41 may be mounted on the support frame 291 and the logic chip 211. An insulating film 8 may fill between the first to fourth semiconductor chips 11, 21, 31 and 41, the support frame 291 and the logic chip 211.

Figure 13A:
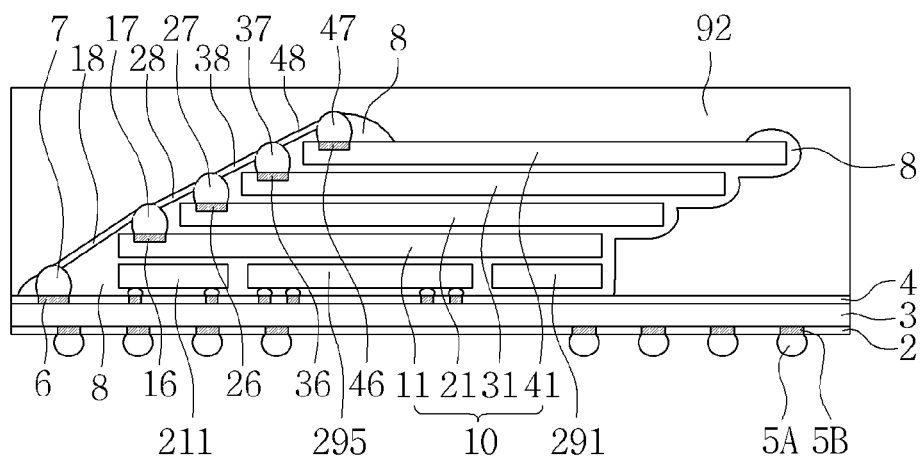

Referring to FIG. 13A, a logic chip 211, a buffer chip 295 and a support frame 291 may be attached on a substrate 3. The logic chip 211 and the buffer chip 295 may be mounted using a flip-chip technique. First to fourth semiconductor chips 11, 21, 31 and 41 may be mounted on the logic chip 211, the buffer chip 295 and the support frame 291. An insulating layer 8 may fill between the first to fourth semiconductor chips 11, 21, 31 and 41, the support frame 291, the buffer chip 295 and the logic chip 211.

The first to fourth semiconductor chips 11, 21, 31 and 41 may be memory chips. For example, the first to fourth semiconductor chips 11, 21, 31 and 41 may include a non-volatile memory device such as a NAND flash memory. The buffer chip 295 may include a semiconductor device having a higher operation velocity than the first to fourth semiconductor chips 11, 21, 31 and 41. For example, the buffer chip 295 may include a volatile memory device such as DRAM or SRAM.

Figure 13B:
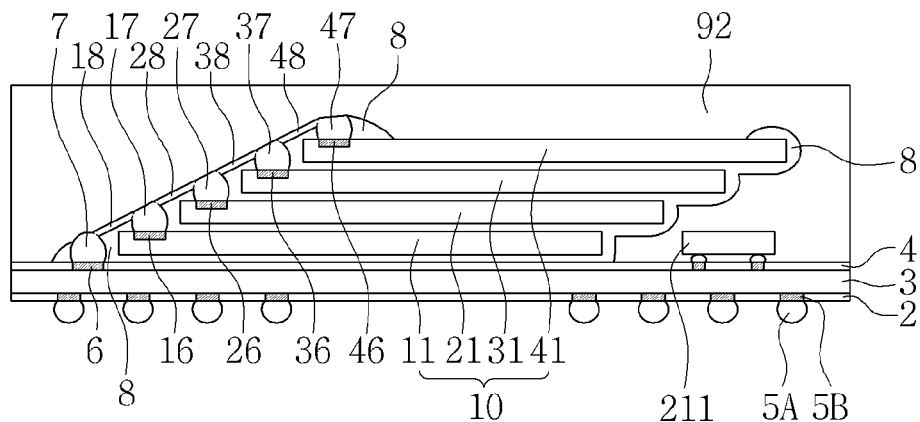

Referring to FIG. 13B, a logic chip 211 may be attached on a substrate 3. The logic chip 211 may be mounted on the same level as a first semiconductor chip 11. The logic chip 211 may be mounted on an outside of an insulating film 8.

Figure 14:
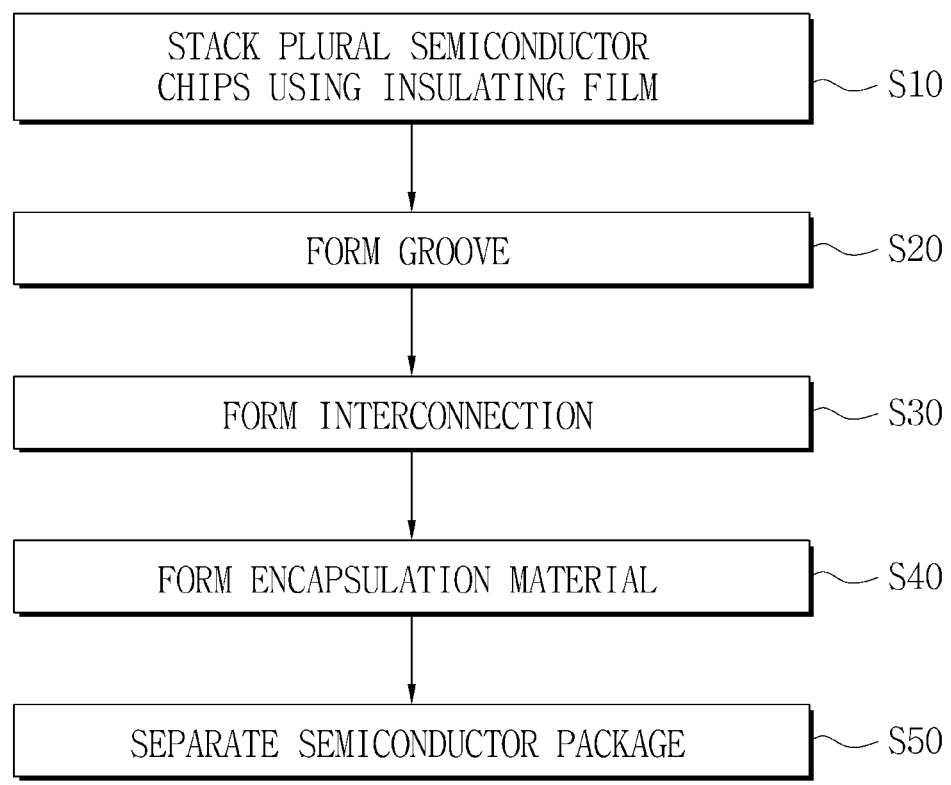
FIG. 14 is a flowchart for explaining methods of fabricating a semiconductor package in accordance with an embodiment of the inventive concept.
Figure 15:
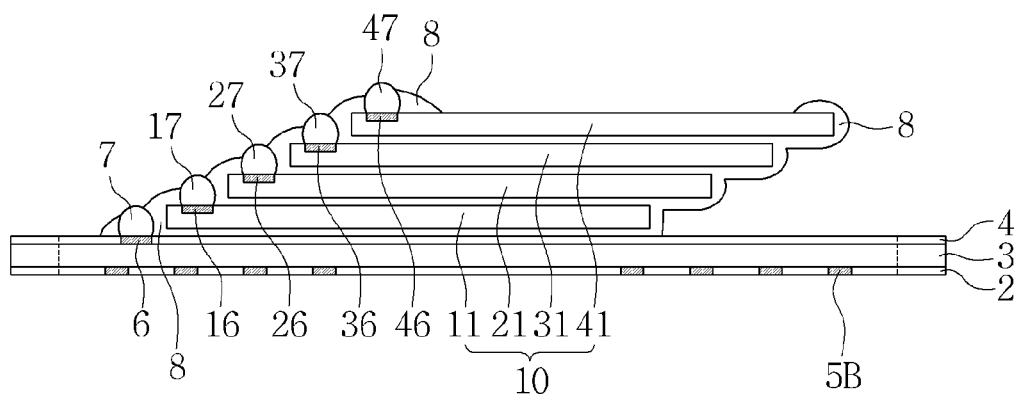
FIGS. 15, 16, 18, 19 and 20 are cross-sectional views for explaining a method of fabricating a semiconductor package in accordance with an embodiment of the inventive concept.
Figure 16:
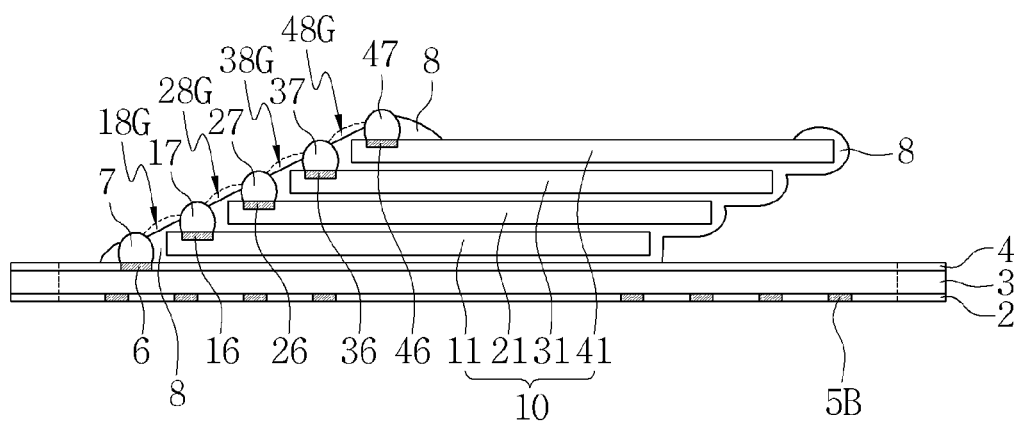
Figure 17A:
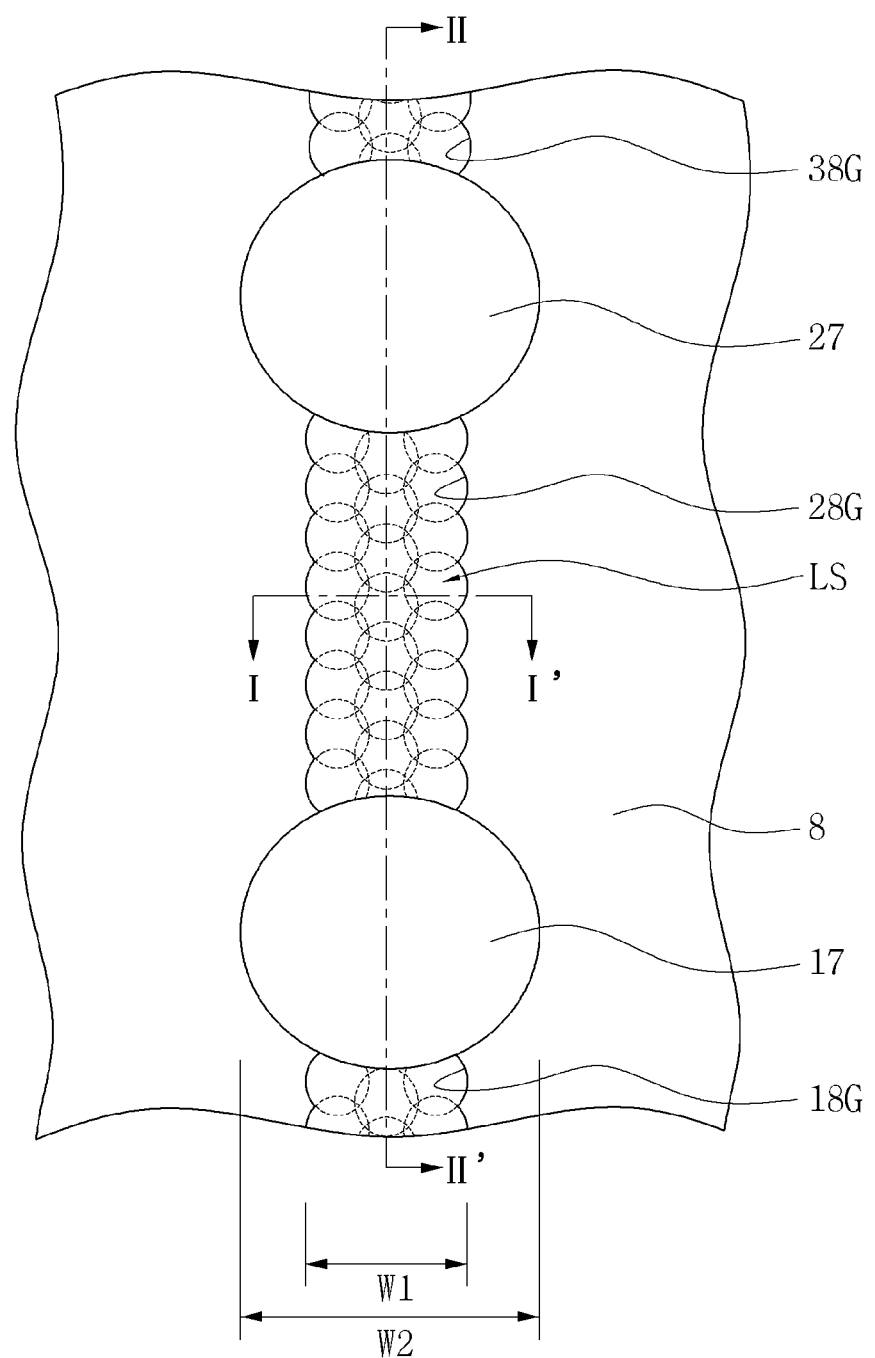
FIG. 17A is an enlarged view specifically showing a portion of FIG. 16.
Figure 17B:
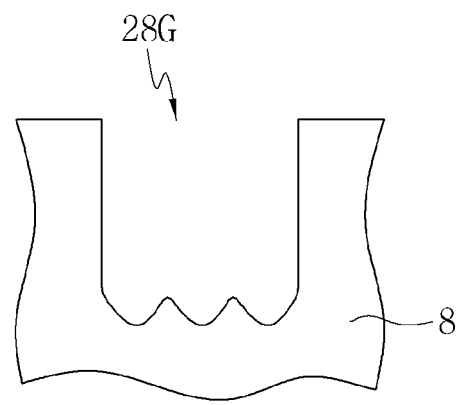
FIG. 17B is a partial cross-sectional view taken along line I-I' of FIG. 17A.
Figure 17C:
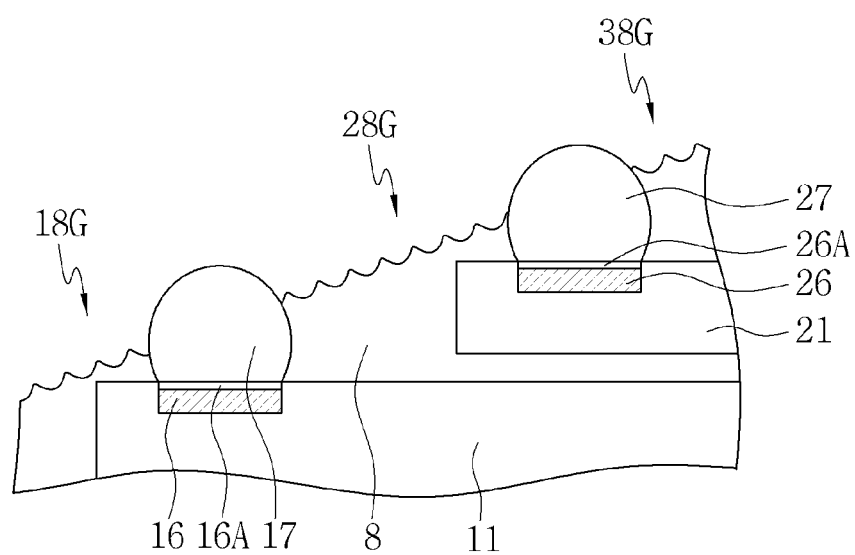
FIG. 17C is a partial cross-sectional view taken along line II-II' of FIG. 17A.

FIG. 14 is a flowchart for explaining methods of fabricating a semiconductor package in accordance with an embodiment of the inventive concept, FIGS. 15, 16, 18, 19 and 20 are cross-sectional views for explaining a method of fabricating a semiconductor package in accordance with an embodiment of the inventive concept, FIG. 17A is an enlarged view specifically showing a portion of FIG. 16, FIG. 17B is a partial cross-sectional view taken along line I-I' of FIG. 17A, and FIG. 17C is a partial cross-sectional view taken along line II-II' of FIG. 17A.

Referring to FIG. 14, a method of fabricating a semiconductor package in accordance with third embodiments of the inventive concept may include stacking a plurality of semiconductor chips using an insulating film (S10), forming a groove in the insulating film (S20), forming interconnections (S30), forming an encapsulation material (S40), and separating a semiconductor package (S50). Hereinafter, the method will be described in detail using process cross-sectional views and partially enlarged views.

Referring to FIGS. 14 and 15, first to fourth semiconductor chips 11, 21, 31 and 41 may be stacked on a substrate 3 using an insulating film 8 (S10). The first to fourth semiconductor chips 11, 21, 31 and 41 may constitute a first chip stack 10.

The substrate 3 may be a rigid printed circuit board, a flexible printed circuit board, or a rigid-flexible printed circuit board. A finger electrode 6 may be formed on one surface of the substrate 3. A lower solder resist 2 may be formed to cover a lower surface of the substrate 3, and an upper solder resist 4 may be formed to cover an upper surface of the substrate 3 and expose the finger electrode 6.

A substrate projection electrode 7 may be formed on the finger electrode 6. The first semiconductor chip 11 may include a first chip pad 16, and a first projection electrode 17 may be formed on the first chip pad 16. The second semiconductor chip 21 may include a second chip pad 26, and a second projection electrode 27 may be formed on the second chip pad 26. The third semiconductor chip 31 may include a third chip pad 36, and a third projection electrode 37 may be formed on the third chip pad 36. The fourth semiconductor chip 41 may include a fourth chip pad 46, and a fourth projection electrode 47 may be formed on the fourth chip pad 46.

The first semiconductor chip 11 may be attached on the substrate 3 using the insulating film 8. The first semiconductor chip 11 may be aligned not to overlap the finger electrode 6 or the substrate projection electrode 7. The second semiconductor chip 21 may be attached on the first semiconductor chip 11 using the insulating film 8. The second semiconductor chip 21 may be offset-aligned on the first semiconductor chip 11 not to overlap the first chip pad 16 or the first projection electrode 17. The third semiconductor chip 31 may be attached on the second semiconductor chip 21 using the insulating film 8. The third semiconductor chip 31 may be offset-aligned on the second semiconductor chip 21 not to overlap the second chip pad 26 or the second projection electrode 27. The fourth semiconductor chip 41 may be attached on the third semiconductor chip 31 using the insulating film 8. The fourth semiconductor chip 41 may be offset-aligned on the third semiconductor chip 31 not to overlap the third chip pad 36 or the third projection electrode 37. In other words, the first to fourth semiconductor chips 11, 21, 31 and 41 may be sequentially offset-mounted in a first direction. The first to fourth semiconductor chips 11, 21, 31 and 41 may form a cascade structure.

The insulating film 8 may fill between the first to fourth semiconductor chips 11, 21, 31 and 41 and fill between the first semiconductor chip 11 and the substrate 3. In addition, the insulating film 8 may cover side surfaces of the first to fourth semiconductor chips 11, 21, 31 and 41. Further, the insulating film 8 may cover the substrate projection electrode 7, the first projection electrode 17, the second projection electrode 27, the third projection electrode 37 and the fourth projection electrode 47. The substrate projection electrode 7, the first projection electrode 17, the second projection electrode 27, the third projection electrode 37 and the fourth projection electrode 47 may be exposed through the insulating film 8. In another embodiment, the insulating film 8 may completely cover the substrate projection electrode 7, the first projection electrode 17, the second projection electrode 27, the third projection electrode 37 and the fourth projection electrode 47.

The insulating film 8 may be formed using liquid epoxy. The insulating film 8 may have adhesion.

The substrate projection electrode 7, the first projection electrode 17, the second projection electrode 27, the third projection electrode 37 and the fourth projection electrode 47 may include a solder ball, a conductive bump, a conductive pin, a conductive spacer, or a combination thereof. In addition, in this embodiment, the substrate projection electrode 7, the first projection electrode 17, the second projection electrode 27, the third projection electrode 37 and the fourth projection electrode 47 will be described under the assumption that they are a solder ball or a solder bump. The substrate projection electrode 7, the first projection electrode 17, the second projection electrode 27, the third projection electrode 37 and the fourth projection electrode 47 may be formed through solder jetting, roll printing, lithographic solder bumping, or a combination thereof.

The finger electrode 6, the first chip pad 16, the second chip pad 26, the third chip pad 36 and the fourth chip pad 46 may include Cu, Al, Ni, Pd, Au, Pt, Ag, W, or a combination thereof. The first to fourth semiconductor chips 11, 21, 31 and 41 may be memory chips. For example, the first to fourth semiconductor chips 11, 21, 31 and 41 may include a nonvolatile memory device such as a NAND flash memory.

Referring to FIGS. 14 and 16, first to fourth grooves 18G, 28G, 38G and 48G may be formed in the insulating film 8 (S20). The first to fourth grooves 18G, 28G, 38G and 48G may be formed using a laser. The insulating film 8 may be remained between the first to fourth grooves 18G, 28G, 38G and 48G and the first to fourth semiconductor chips 11, 21, 31 and 41. In the drawings, a surface of the insulating film 8 before the first to fourth grooves 18G, 28G, 38G and 48G are formed is represented as dotted lines, and bottom surfaces of the first to fourth grooves 18G, 28G, 38G and 48G are represented as solid lines.

The substrate projection electrode 7, the first projection electrode 17, the second projection electrode 27, the third projection electrode 37 and the fourth projection electrode 47 may show characteristics of reflecting a laser. Accordingly, the substrate projection electrode 7, the first projection electrode 17, the second projection electrode 27, the third projection electrode 37 and the fourth projection electrode 47 may function to prevent the finger electrode 6, the first chip pad 16, the second chip pad 26, the third chip pad 36 and the fourth chip pad 46 from being damaged by a laser while forming the first to fourth grooves 18G, 28G, 38G and 48G. That is, the substrate projection electrode 7, the first projection electrode 17, the second projection electrode 27, the third projection electrode 37 and the fourth projection electrode 47 may block a laser.

In another embodiment, the first to fourth grooves 18G, 28G, 38G and 48G may be formed using a mechanical drilling or etching technique.

Referring to FIGS. 17A, 17B and 17C, the first to third grooves 18G, 28G and 38G may have a first width W1. The first projection electrode 17 and the second projection electrode 27 may have a second width W2. The first width W1 may be smaller than the second width W2. Inner walls of the first to third grooves 18G, 28G and 38G may be formed to have rough surfaces corresponding to laser spots LS. That is, sidewalls and bottoms of the first to third grooves 18G, 28G and 38G may be uneven. Side surfaces and upper ends of the first projection electrode 17 and the second projection electrode 27 may be exposed by the first to third grooves 18G, 28G and 38G.

A first UBM 16A may be formed on the first chip pad 16, and a second UBM 26A may be formed on the second chip pad 26. The first UBM 16A may be interposed between the first chip pad 16 and the first projection electrode 17, and the second UBM 26A may be interposed between the second chip pad 26 and the second projection electrode 27. The first UBM 16A and the second UBM 26A may include Ni, Pd, Au, or a combination thereof. For example, the first chip pad 16 and the second chip pad 26 may be Cu or Al, and the first UBM 16A and the second UBM 26A may be electroless Ni, Ni/Pd, or Ni/Pd/Au.

Figure 18:
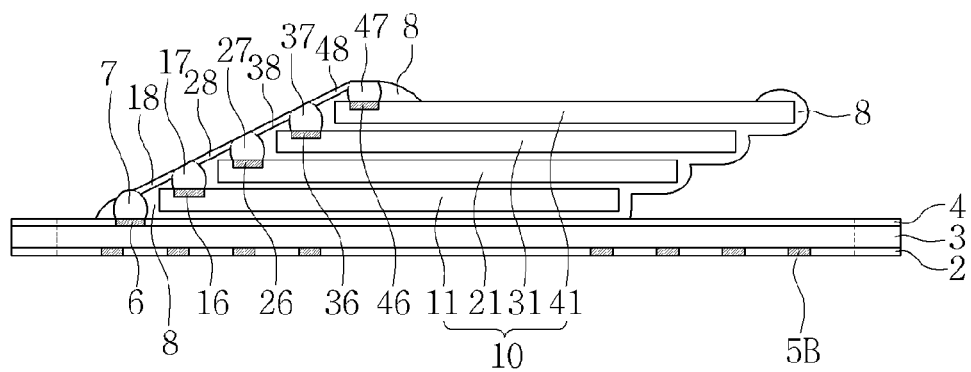

Referring to FIGS. 14 and 18, first to fourth interconnections 18, 28, 38 and 48 may be formed along the first to fourth grooves 18G, 28G, 38G and 48G (S30).

Forming the first to fourth interconnections 18, 28, 38 and 48 may include melting the first projection electrode 17, the second projection electrode 27, the third projection electrode 37 and the fourth projection electrode 47 to be flowed down along the first to fourth grooves 18G, 28G, 38G and 48G. In this case, each of the first to fourth interconnections 18, 28, 38 and 48 may be in physical continuity with a corresponding one of the first projection electrode 17, the second projection electrode 27, the third projection electrode 37 and the fourth projection electrode 47. That is, the first to fourth interconnections 18, 28, 38 and 48 and the first to fourth projection electrodes 17, 27, 37 and 47 may include the same material. The first to fourth interconnections 18, 28, 38 and 48 may be connected to the substrate projection electrode 7, the first projection electrode 17, the second projection electrode 27, the third projection electrode 37 and the fourth projection electrode 47.

Figure 19:
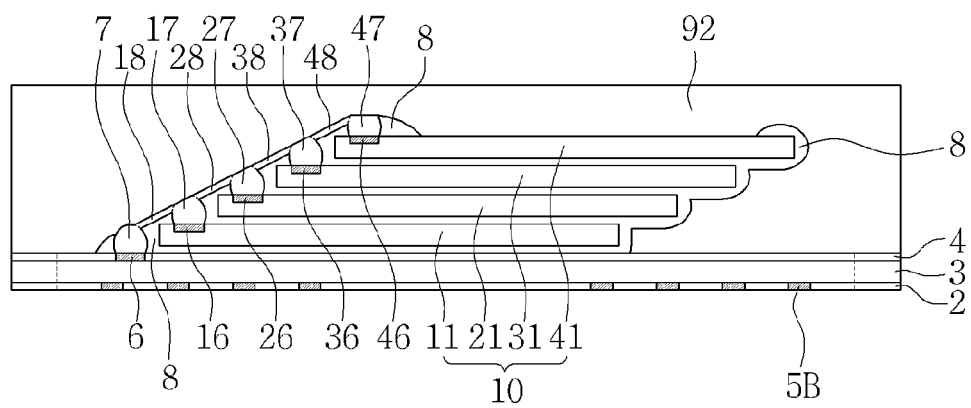

Referring to FIGS. 14 and 19, an encapsulation material 92 configured to cover the first chip stack 10 may be formed on the substrate 3 (S40). The encapsulation material 92 may be formed using a molding compound.

Figure 20:
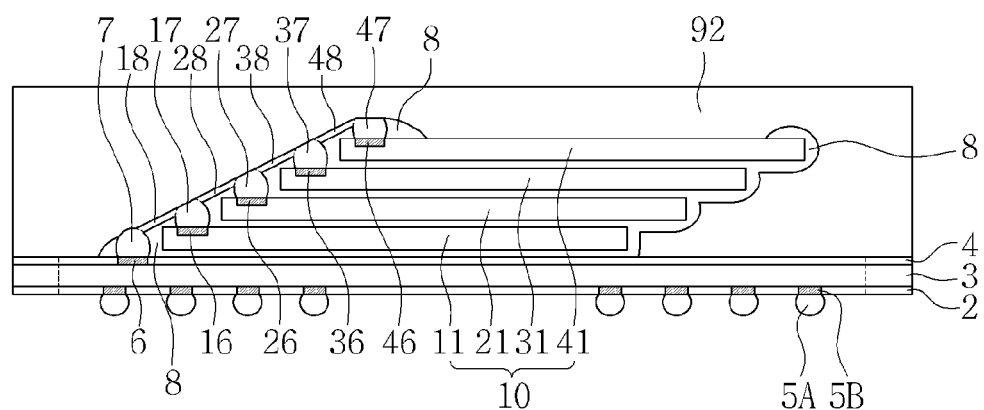

Referring to FIGS. 14 and 20, first and second external terminals 5A and 5B may be formed at a rear surface of the substrate 3. The first external terminals 5a may include a solder ball, a solder bump, a pin grid array, a lead grid array, a conductive tab, or a combination thereof. In another embodiment, the first external terminals 5A may be omitted. The second external terminals 5B may include a metal bump or a solder land. In another embodiment, the second external terminals 5B may be omitted.

Next, a process of separating a semiconductor package may be performed (S50). The process of separating the semiconductor package may include cutting the encapsulation material 92 and the substrate 3 using a sawing process. As a result, a semiconductor package similar to that described with reference to FIG. 1 may be formed.

Figure 21:
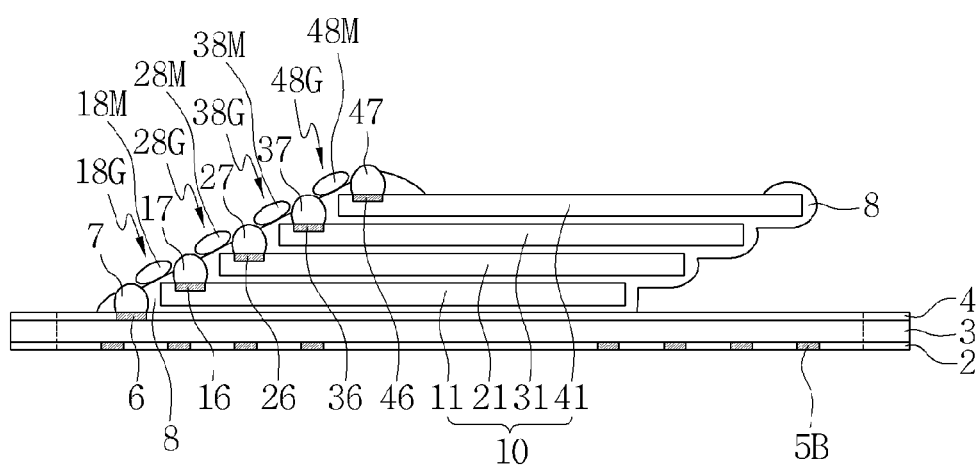
FIGS. 21 to 23 are cross-sectional views for explaining a method of fabricating semiconductor packages in accordance with applied embodiments.
Figure 22:
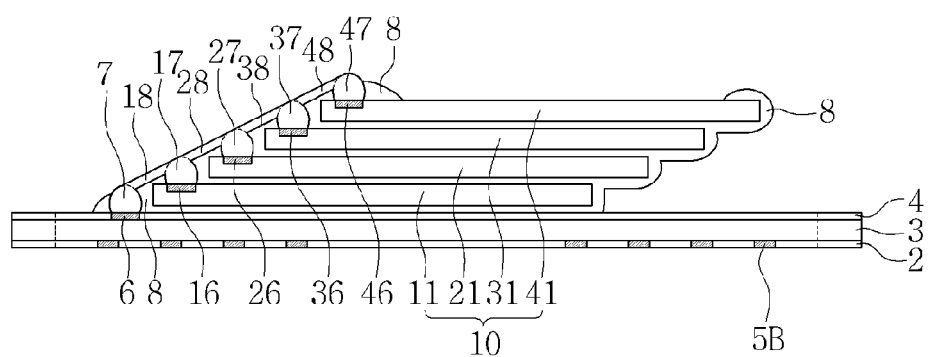
Figure 23:
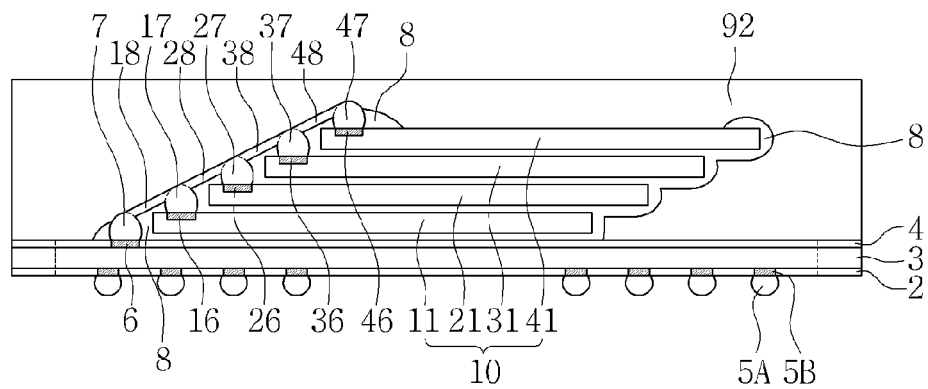

FIGS. 21 to 23 are cross-sectional views for explaining a method of fabricating a semiconductor package in accordance with an applied embodiment.

Referring to FIG. 21, first to fourth conductive materials 18M, 28M, 38M and 48M may be additionally provided along first to fourth grooves 18G, 28G, 38G and 48G. The first to fourth conductive materials 18M, 28M, 38M and 48M may include a conductive paste, a conductive ball, or a combination thereof. The first to fourth conductive materials 18M, 28M, 38M and 48M may be a different material film than the substrate projection electrode 7, the first projection electrode 17, the second projection electrode 27, the third projection electrode 37 and the fourth projection electrode 47. The first to fourth conductive materials 18M, 28M, 38M and 48M may be a material that melts at a temperature lower than those of the substrate projection electrode 7, the first projection electrode 17, the second projection electrode 27, the third projection electrode 37 and the fourth projection electrode 47.

For example, the substrate projection electrode 7, the first projection electrode 17, the second projection electrode 27, the third projection electrode 37 and the fourth projection electrode 47 may be a first solder ball including Sn—Ag—Cu. The first solder ball may show a characteristic of melting at a temperature of 217° C. to 221° C. In this case, the first to fourth conductive materials 18M, 28M, 38M and 48M may be a second solder ball including Sn—Bi, or a third solder ball including Sn—Zn. The second solder ball may show a characteristic of melting at a temperature of 138° C., and the third solder ball may show a characteristic of melting at a temperature of about 200° C.

In another embodiment, the first to fourth conductive materials 18M, 28M, 38M and 48M may be the same material as the substrate projection electrode 7, the first projection electrode 17, the second projection electrode 27, the third projection electrode 37 and the fourth projection electrode 47.

Referring to FIG. 22, the first to fourth conductive materials 18M, 28M, 38M and 48M may be melted to form first to fourth interconnections 18, 28, 38 and 48 along the first to fourth grooves 18G, 28G, 38G and 48G. The first to fourth interconnections 18, 28, 38 and 48 may contact the substrate projection electrode 7, the first projection electrode 17, the second projection electrode 27, the third projection electrode 37 and the fourth projection electrode 47.

In another embodiment, the first to fourth interconnections 18, 28, 38 and 48 may cover side surfaces and upper ends of the substrate projection electrode 7, the first projection electrode 17, the second projection electrode 27, the third projection electrode 37 and the fourth projection electrode 47.

Referring to FIG. 23, an encapsulation material 92 configured to cover a first chip stack 10 may be formed on a substrate 3. External terminals 5A and 5B may be formed at a rear surface of the substrate 3.

Next, the encapsulation material 92 and the substrate 3 may be cut using a sawing process. As a result, a semiconductor package similar to that described with reference to FIG. 7A may be formed.

FIGS. 24 to 28 are cross-sectional views for explaining a method of fabricating a semiconductor package in accordance with still another embodiment.

Figure 24:
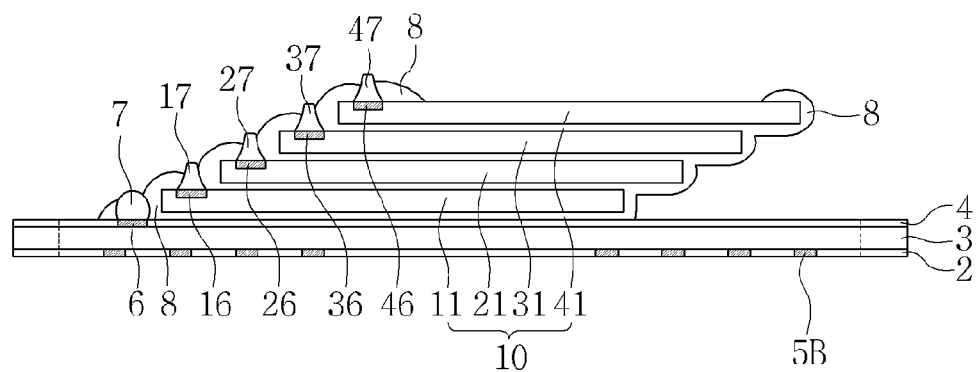
FIGS. 24 to 28 are cross-sectional views for explaining a method of fabricating semiconductor packages in accordance with another embodiment.

Referring to FIG. 24, a substrate projection electrode 7 may be a solder ball or a solder bump, and a first projection electrode 17, a second projection electrode 27, a third projection electrode 37 and a fourth projection electrode 47 may be a conductive pin or a conductive spacer.

Figure 25:
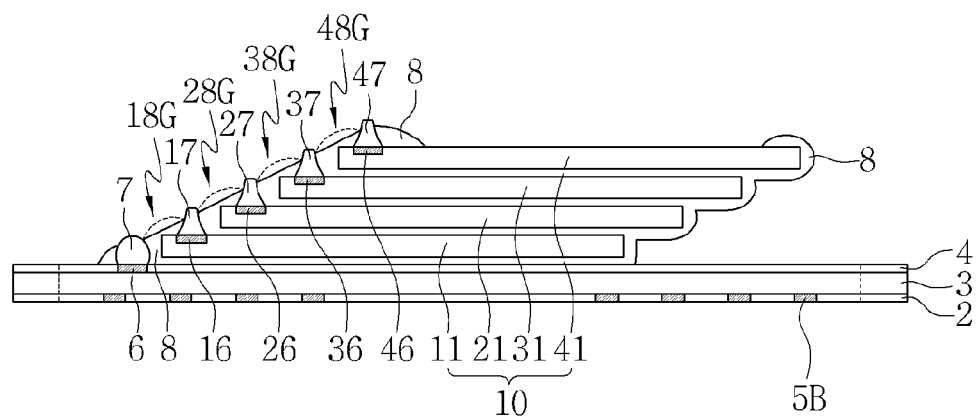

Referring to FIG. 25, first to fourth grooves 18G, 28G, 38G and 48G may be formed in an insulating film 8 using a laser.

Figure 26:
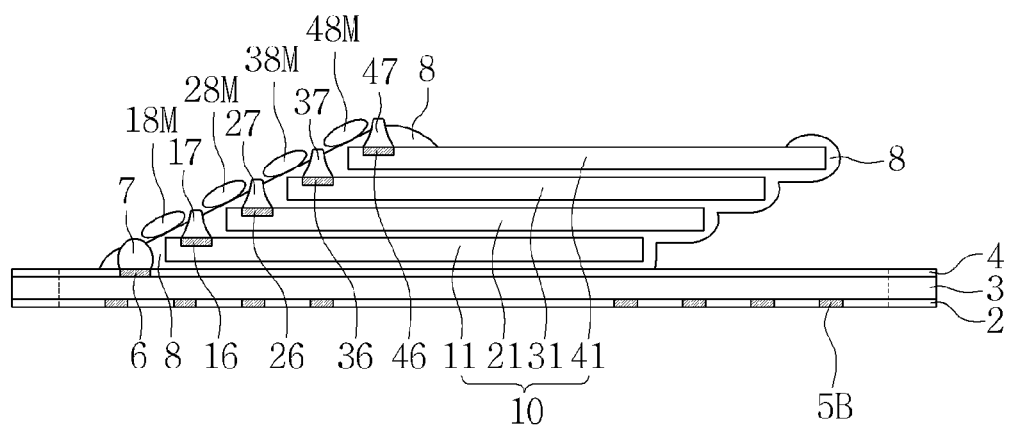

Referring to FIG. 26, first to fourth conductive materials 18M, 28M, 38M and 48M may be additionally provided along the first to fourth grooves 18G, 28G, 38G and 48G. The first to fourth conductive materials 18M, 28M, 38M and 48M may be a different material than the first projection electrode 17, the second projection electrode 27, the third projection electrode 37 and the fourth projection electrode 47. The first to fourth conductive materials 18M, 28M, 38M and 48M may be a material that melts at a temperature lower than those of the first projection electrode 17, the second projection electrode 27, the third projection electrode 37 and the fourth projection electrode 47.

Figure 27:
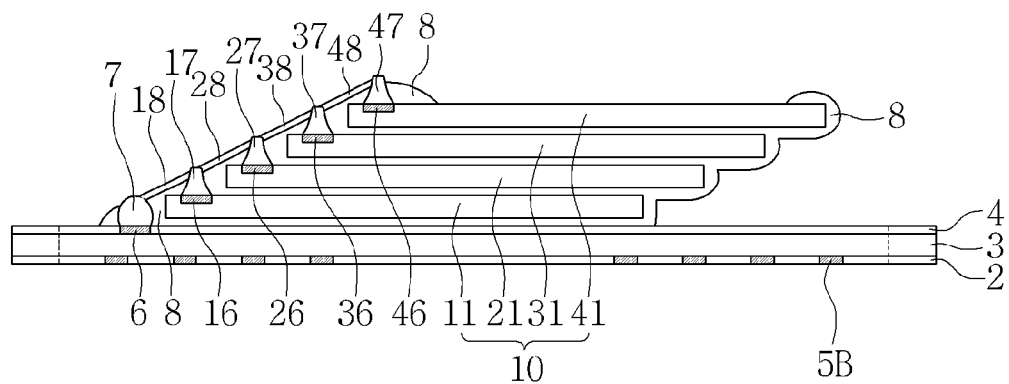

Referring to FIG. 27, the first to fourth conductive materials 18M, 28M, 38M and 48M may be melted to form first to fourth interconnections 18, 28, 38 and 48 along the first to fourth grooves 18G, 28G, 38G and 48G.

Figure 28:
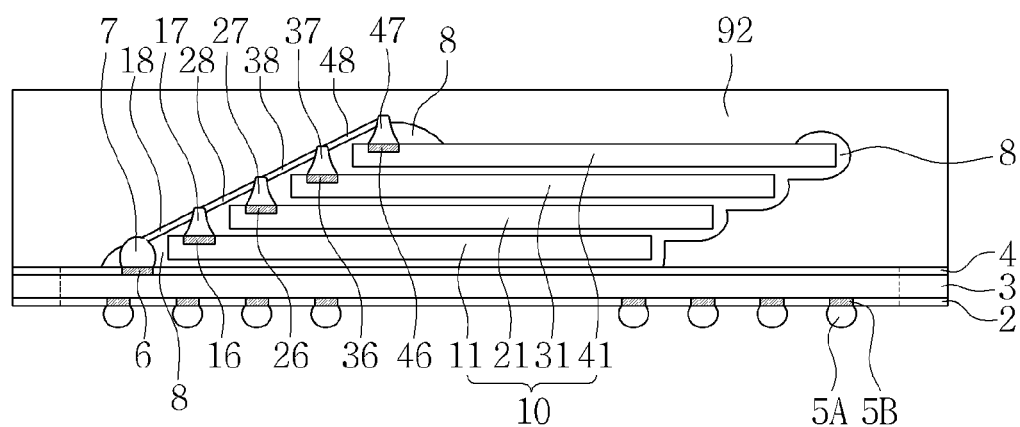

Referring to FIG. 28, an encapsulation material 92 configured to cover a first chip stack 10 may be formed on a substrate 3. External terminals 5A and 5B may be formed on a rear surface of the substrate 3.

Next, the encapsulation material 92 and the substrate 3 may be cut using a sawing process. As a result, a semiconductor package similar to that described with reference to FIG. 9B may be formed.

As described above, according to a method of fabricating a semiconductor package in accordance with a third embodiment of the inventive concept, the first to fourth grooves 18G, 28G, 38G and 48G may be formed in the insulating film 8. While forming the first to fourth grooves 18G, 28G, 38G and 48G, the projection electrodes 7, 17, 27, 37 and 47 may function to prevent the finger electrode 6 and the first to fourth chip pads 16, 26, 36 and 46 from being damaged by a laser. In addition, inner walls of the first to fourth grooves 18G, 28G, 38G and 48G may be formed to have rough surfaces corresponding to sizes of laser spots LS. Accordingly, the first to fourth interconnections 18, 28, 38 and 48 may show very good adhesion.

Further, in comparison with a conventional art using a bonding wire, the first to fourth interconnections 18, 28, 38 and 48 can obtain various improvement effects in quality and productivity such as reduction in signal transmission path, reduction in failure such as chips/cracks, reduction in material cost, and reduction in process time. Furthermore, the insulating film 8 may be formed of liquid epoxy having a relatively lower material cost and shorter process time than a direct adhesive film (DAF). In addition, since the insulating film 8 may cover side surfaces of the first to fourth semiconductor chips 11, 21, 31 and 41 and cover side surfaces of the projection electrodes 7, 17, 27, 37 and 47, it is possible to implement a semiconductor package having good moisture resistance and reliability.

Figure 29:
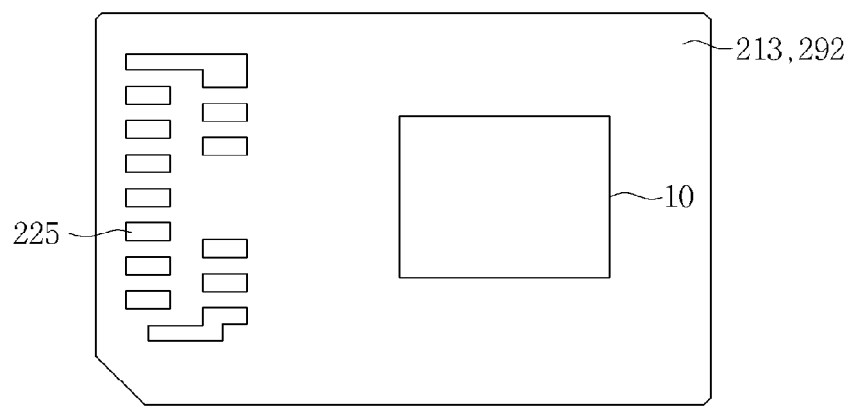
FIG. 29 is a layout for explaining a card package in accordance with an embodiment of the inventive concept.
Figure 30:
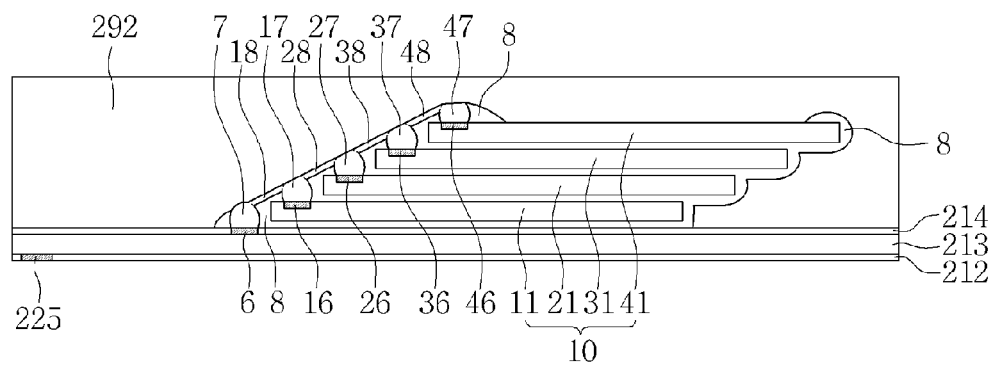
FIG. 30 is a cross-sectional view for explaining the card package in accordance with an embodiment of the inventive concept.

FIG. 29 is a layout for explaining a card package in accordance with an embodiment of the inventive concept, and FIG. 30 is a cross-sectional view for explaining the card package in accordance with an embodiment of the inventive concept.

Referring to FIGS. 29 and 30, first to fourth semiconductor chips 11, 21, 31 and 41 may be mounted on a card substrate 213 using an insulating film 8. The first to fourth semiconductor chips 11, 21, 31 and 41 may constitute a first chip stack 10. The card substrate 213 may be covered with a lower solder resist 212 and an upper solder resist 214. External terminals 225 may be formed on one surface of the card substrate 213. The external terminals 225 may include conductive tabs. An encapsulation material 292 configured to cover the first chip stack 10 may be provided on the card substrate 213.

As described above, a configuration of the insulating film 8, projection electrodes 7, 17, 27, 37 and 47, and interconnections 18, 28, 38 and 48 can show various improvement effects such as reduction in signal transmission path, reduction in failure, reduction in material cost, and reduction in process time. Thereby, it is possible to implement a card package configured to mount a plurality of semiconductor chips thereon and having good quality and productivity.

Further, semiconductor packages and methods of fabricating the same described with reference to FIGS. 1 to 28 may be variously applied to a card package and a method of fabricating the same.

Figure 31:
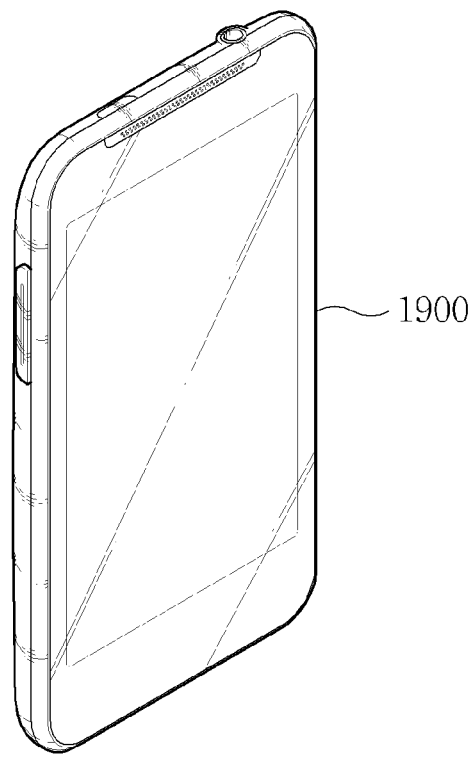

FIGS. 31 and 32 are a perspective view and a system block diagram of an electronic device in accordance with an embodiment of the inventive concept.

Referring to FIG. 31, semiconductor packages and methods of fabricating the same described with reference to FIGS. 1 to 30 may be usefully applied to an electronic system such as a mobile phone 1900, a net-book, a notebook, or a tablet PC. For example, a semiconductor package similar to that described with reference to FIGS. 1 to 30 may be mounted on a main board in the mobile phone 1900. Further, a semiconductor package similar to that described with reference to FIGS. 1 to 30 may be coupled to the mobile phone 1900 to be used therewith by providing an extension apparatus such as a removable memory card.

Referring to FIG. 32, a semiconductor package similar to that described with reference to FIGS. 1 to 30 may be applied to an electronic system 2100. The electronic system 2100 may include a body 2110, a microprocessor unit 2120, a power unit 2130, a function unit 2140, and a display controller unit 2150. The body 2110 may be a mother board formed of a printed circuit board (PCB). The microprocessor unit 2120, the power unit 2130, the function unit 2140, and the display controller unit 2150 may be mounted on the body 2110. A display unit 2160 may be disposed inside or outside the body 2110. For example, the display unit 2160 may be disposed on a surface of the body 2110 to display an image processed by the display controller unit 2150.

The power unit 2130 may function to receive a certain voltage from an external battery (not shown), etc. and distribute the voltage in desired voltage levels to supply the distributed voltages to the microprocessor unit 2120, the function unit 2140, the display controller unit 2150, and so on. The microprocessor unit 2120 may receive a voltage from the power unit 2130 to control the function unit 2140 and the display unit 2160. The function unit 2140 may perform various functions of the electronic system 2100. For example, when the electronic system 2100 is a mobile phone, the function unit 2140 may include various components that can perform functions of a mobile phone such as dialing, image output to the display unit 2160 through communication with an external apparatus 2170, sound output to a speaker, and so on. In addition, when the electronic system 2100 is equipped with a camera, the function unit 2140 may perform a function of a camera image processor.

In an applied embodiment, when the electronic system 2100 is connected to a memory card, etc. to expand its capacity, the function unit 2140 may be a memory card controller. The function unit 2140 may transmit and receive a signal to/from the external apparatus 2170 through a wired or wireless communication unit 2180. Further, when the electronic system 2100 requires a universal serial bus (USB) to extend functions thereof, the function unit 2140 may function as an interface controller. In addition, the function unit 2140 may include a large capacity storage device.

A semiconductor package similar to that described with reference to FIGS. 1 to 30 may be applied to the function unit 2140. For example, the function unit 2140 may include the substrate 3, the external terminals 5, the insulating film 8, the chip stack 10, and the first to fourth interconnections 18, 28, 38 and 48. The external terminals 5 may be connected to the body 2110. In this case, the electronic system 2100, on which a plurality of semiconductor chips are mounted, can show various improvement effects in quality and productivity.

As can be seen from the foregoing, a semiconductor package having an insulating film, projection electrodes and interconnections may be provided. Accordingly, it is possible to implement a semiconductor package having various improvement effects such as reduction in signal transmission path, reduction in failure such as chips/cracks, reduction in material cost, and reduction in process time.

The foregoing is illustrative of embodiments and is not to be construed as limiting thereof. Although a few embodiments have been described, those skilled in the art will readily appreciate that many modifications are possible in embodiments without materially departing from the novel teachings and advantages. Accordingly, all such modifications are intended to be included within the scope of this inventive concept as defined in the claims. In the claims, means-plus-function clauses are intended to cover the structures described herein as performing the recited function, and not only structural equivalents but also equivalent functions. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. A method of fabricating a semiconductor package, comprising:
   preparing a first semiconductor chip having a first projection electrode formed on an upper surface thereof;
   mounting a second semiconductor chip having a second projection electrode on the first semiconductor chip to expose the first projection electrode;
   forming an insulating film between the first projection electrode and the second projection electrode;
   forming a groove in the insulating film; and
   forming an interconnection configured to fill an inside of the groove and connected to the first projection electrode and the second projection electrode.

2. The method according to claim 1, wherein forming the groove comprises forming the groove such that a width of the groove is smaller than that of the first projection electrode.

3. The method according to claim 1, wherein forming the groove comprises removing a portion of the insulating film using a laser.

4. The method according to claim 1, wherein forming the interconnection comprises filling the groove by melting a portion of the second projection electrode.

5. The method according to claim 1, wherein the method further comprises forming the interconnection using the same material film as the second projection electrode, and the interconnection is in physical continuity with the second projection electrode.

6. The method according to claim 1, wherein forming the interconnection comprises providing a conductive paste, a conductive ball, or a combination thereof in the groove.

7. The method according to claim 1, wherein the method further comprises forming the interconnection using a material that melts at a temperature lower than those of the first projection electrode and the second projection electrode.

8. The method according to claim 1, wherein the method further comprises forming the interconnection such that the interconnection has a vertical depth larger than a horizontal width thereof.

9. The method according to claim 1, wherein the method further comprises forming the interconnection such that the interconnection covers a portion of an upper surface of the insulating film.

10. The method according to claim 1, wherein the method further comprises forming the interconnection such that the interconnection has a width smaller than that of the first projection electrode.

11. The method according to claim 1, wherein the method further comprises forming the interconnection such that the interconnection contacts an upper surface of the first projection electrode and a side surface of the second projection electrode.

12. The method according to claim 1, wherein the method further comprises forming the groove such that a sidewall of the groove is uneven.

13. The method according to claim 1, wherein the method further comprises forming the insulating film such that the insulating film fills between the first semiconductor chip and the second semiconductor chip.

14. The method according to claim 1, further comprising:
attaching a substrate to a bottom of the first semiconductor chip;
mounting a logic chip and a buffer chip between the substrate and the first semiconductor chip; and
forming an encapsulation material configured to cover the logic chip, the buffer chip, the first semiconductor chip and the second semiconductor chip on the substrate.

15. A method of fabricating a semiconductor package, comprising:
preparing a first semiconductor chip having a first chip pad and a first laser blocking electrode formed on the first chip pad, and a second semiconductor chip having a second chip pad and a second laser blocking electrode formed on the second chip pad;
mounting the second semiconductor chip on the first semiconductor chip to expose the first laser blocking electrode;
forming an insulating film between the first laser blocking electrode and the second laser blocking electrode;
forming a groove in the insulating film using a laser; and
forming an interconnection in contact with the first laser blocking electrode and the second laser blocking electrode in the groove.

16. A method of fabricating a semiconductor package comprising:
preparing a substrate including a finger electrode and a substrate projection electrode, the substrate projection electrode being formed on the finger electrode;
mounting a first semiconductor chip on the substrate, the first semiconductor chip including a first chip pad and a first projection electrode formed on the first chip pad, the first semiconductor chip being arranged to not overlap the finger electrode or the substrate projection electrode;
mounting a second semiconductor chip on the first semiconductor chip to expose the first projection electrode, the second semiconductor chip including a second chip pad and a second projection electrode formed on the second chip pad, the first and second semiconductor chips being mounted using an insulating film, the insulating film being formed between the first projection electrode and the second projection electrode;
forming a first groove in the insulating film between the substrate projection electrode and the first projection electrode, a second groove being formed between the first projection electrode and the second projection electrode;
forming a first interconnection along the first groove and a second interconnection along the second groove, the first and second interconnections being physically and/or electrically connected to the substrate projection electrode, the first projection electrode, and the second projection electrode; and
forming first and second external terminals at a rear surface of the substrate.

17. The method according to claim 16, further comprising:
mounting a logic chip and a buffer chip between the substrate and the first semiconductor chip; and
forming on the substrate an encapsulation material configured to cover the logic chip, the buffer chip, the first semiconductor chip, and the second semiconductor chip.

18. The method according to claim 16, further comprising offset-mounting the first and second semiconductor chips in a first direction such that the first and second semiconductor chip constitute a cascade structure.

19. The method according to claim 16, further comprising forming the first and second grooves such that the first and second grooves have uneven sidewalls and bottoms.

20. The method according to claim 16, further comprising interposing a first under bump metal between the first chip pad and the first projection electrode, and interposing a second under bump metal between the second chip pad and the second projection electrode.

* * * * *